US 9,583,796 B2

United States Patent
Saha et al.

(10) Patent No.: US 9,583,796 B2
(45) Date of Patent: *Feb. 28, 2017

(54) METHOD FOR MONITORING/MANAGING ELECTROCHEMICAL ENERGY DEVICE BY DETECTING INTERCALATION STAGE CHANGES

(71) Applicant: Palo Alto Research Center Incorporated, Palo Alto, CA (US)

(72) Inventors: Bhaskar Saha, Redwood City, CA (US); Ajay Raghavan, Mountain View, CA (US); Peter Kiesel, Palo Alto, CA (US); Lars Wilko Sommer, Bretten (DE); Alexander Lochbaum, Landau (DE); Tobias Staudt, Nuremberg (DE); Saroj Kumar Sahu, Fremont, CA (US); Anurag Ganguli, Milpitas, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 148 days.

This patent is subject to a terminal disclaimer.

(21) Appl. No.: 14/242,850

(22) Filed: Apr. 1, 2014

(65) Prior Publication Data

US 2015/0280290 A1 Oct. 1, 2015

(51) Int. Cl.
*H01M 10/48* (2006.01)
*G01R 31/36* (2006.01)
(Continued)

(52) U.S. Cl.
CPC ............ *H01M 10/48* (2013.01); *G01D 5/353* (2013.01); *G01D 5/35316* (2013.01);
(Continued)

(58) Field of Classification Search
None
See application file for complete search history.

(56) References Cited

U.S. PATENT DOCUMENTS 5,949,219 A 9/1999 Weiss
7,155,075 B2 12/2006 Rajendran et al.
(Continued)

OTHER PUBLICATIONS

Wang et al., Understanding Volume Change in Lithium-Ion Cells during Charging and Discharging Using In Situ Measurements, Journal of the Electrochemical Society, 154 (1) A14-A21 (2007).*
(Continued)

*Primary Examiner* — Patrick Ryan
*Assistant Examiner* — Christopher Domone
(74) *Attorney, Agent, or Firm* — Hollingsworth Davis, LLC

(57) ABSTRACT

A method for determining an operating state (e.g., state-of-charge or state-of-health) and/or generating management (charge/discharge) control information in a system including an electrochemical energy device (EED, e.g., a rechargeable Li-ion battery, supercapacitor or fuel cell) that uses optical sensors to detect the intercalation stage change events occurring in the EED. The externally or internally mounted optical sensors measure operating parameter (e.g., strain and/or temperature) changes of the EED during charge/recharge cycling, and transmit measured parameter data using light signals sent over optical fibers to a detector/converter. A processor then analyzes the measured parameter data, e.g., using a model-based estimation process, to detect intercalation stage changes (i.e., crystalline structure changes caused by migration of guest species, such as Li-ions, between the EED's anode and cathode), and generates the operating state and charge/discharge control information based the analysis.

20 Claims, 13 Drawing Sheets

(51) Int. Cl.
- H01M 10/42 (2006.01)
- G01D 5/353 (2006.01)
- G01M 11/08 (2006.01)
- G01L 1/24 (2006.01)
- H01M 10/44 (2006.01)

(52) U.S. Cl.
CPC ........... *G01L 1/246* (2013.01); *G01M 11/085* (2013.01); *G01R 31/3679* (2013.01); *H01M 10/425* (2013.01); *H01M 10/4257* (2013.01); *H01M 10/486* (2013.01); *H01M 10/44* (2013.01); *H01M 2010/4271* (2013.01); *H01M 2010/4278* (2013.01)

(56) References Cited

U.S. PATENT DOCUMENTS

| | | | |
|---|---|---|---|
| 7,310,153 | B2 | 12/2007 | Kiesel et al. |
| 7,315,667 | B2 | 1/2008 | Schmidt et al. |
| 7,433,552 | B2 | 10/2008 | Kiesel et al. |
| 7,511,823 | B2 | 3/2009 | Schultz et al. |
| 7,522,786 | B2 | 4/2009 | Kiesel et al. |
| 7,701,590 | B2 | 4/2010 | Kiesel et al. |
| 7,718,948 | B2 | 5/2010 | Kiesel et al. |
| 7,766,544 | B2 | 8/2010 | Shibuya et al. |
| 8,437,582 | B2 | 5/2013 | Kiesel et al. |
| 8,594,470 | B2 | 11/2013 | Kiesel et al. |
| 9,209,494 | B2 * | 12/2015 | Kiesel ............. H01M 10/42 |
| 2009/0027009 | A1 | 1/2009 | Sivertsen |
| 2009/0220189 | A1 | 9/2009 | Kiesel et al. |
| 2010/0124250 | A1 | 5/2010 | Lachenmeier et al. |
| 2014/0203783 | A1 | 7/2014 | Kiesel et al. |
| 2014/0272521 | A1 * | 9/2014 | Beckman .......... H01M 10/4207 429/122 |

OTHER PUBLICATIONS

WangM et al., Simultaneous measurement of strain and temperature using dual-period fiber grating, Proceedings of SPIE vol. 4579, APOC 2001, Beijing, China (2001), pp. 265-268.*
Cao-Paz et al. "A Multi-Point Sensor Based on Optical Fiber for the Measurement of Electrolyte Density in Lead-Acid Batteries", Sensors 2010, 10, pp. 2587-2608.
Chehura et al. "Temperature and strain discrimination using a single tilted fibre Bragg grating", Opt. Commun., vol. 275, No. 2, Jul. 2007, pp. 344-347.
Corbellini et al. "Modified POF Sensor for Gaseous Hydrogen Fluoride Monitoring in the Presence of Ionizing Radiations", IEEE Transactions on Instrumentation and Measurement, vol. 61, No. 5, May 2012, pp. 1201-1208.
Grobnic et al. "Sapphire Fiber Bragg Grating Sensor Made Using Femtosecond Laser Radiation for Ultrahigh Temperature Applications", IEEE Photonics Technology Letters, vol. 16, No. 11, Nov. 2004, pp. 2505-2507.
Guan et al. "Simultaneous strain and temperature measurement using a single fibre Bragg grating", Electron. Lett., vol. 36, No. 12, 2000, pp. 1018-1019.
Jansen et al. "Low-Cost Flexible Packaging for High-Power Li-Ion HEV Batteries", FreedomCar & Vehicle Technologies Office, Jun. 2004, 56 pages.
Jin et al. "Simultaneous measurement of strain and temperature: error analysis", Opt. Eng., vol. 36, No. 2, 1997, pp. 598-609.
Juergens et al. "Performance Evaluation of Fiber Bragg Gratings at Elevated Temperatures", NASA, Jan. 2004, 14 pages.
Kersey et al. "Fiber Grating Sensors", Journal of Lightwave Technology, vol. 15, No. 8, Aug. 1997, pp. 1442-1463.
Klein et al. "Optimal Charging Strategies in Lithium-Ion Battery", American Control Conference (ACC), Jun. 2011, pp. 382-387.
Kumai et al. "Gas Generation Mechanism Due to Electrolyte Decomposition in Commercial Lithium-Ion Cell", Journal of Power Sources, 81-82, 1999, pp. 715-719.
Lee et al. "In Situ Monitoring of Temperature Inside Lithium-Ion Batteries by Flexible Micro Temperature Sensors", Sensors 2011, 11, pp. 9942-9950.
Liang et al. "Highly Sensitive Fiber Bragg Grating Refractive Index Sensors", Applied Physics Letters, vol. 86, 2005, pp. 151122-1-151122-3.
Merzbacher et al. "Fiber Optic Sensors in Concrete Structures: A Review", Smart Mater. Struct., 5, 1996, pp. 196-208.
Micron Optics, "Optical Fiber Sensors Guide", 21 pages [Date Unknown], 1997 based on References.
Patrick et al. "Hybrid fiber Bragg grating/long period fiber grating sensor for strain/temperature discrimination", IEEE Photonics Technol. Lett., vol. 8, No. 9, 1996, pp. 1223-1225.
Qi et al. "In Situ Observation of Strains During Lithiation of a Graphite Electrode", Journal of the Electrochemical Society, vol. 157 (6), 2010, pp. A741-A747.
Qin et al. "Specific Fluorescence Determination of Lithium Ion Based on 2-(2-hydroxyphenyl)benzoxazole", The Royal Society of Chemistry, 2001, pp. 1499-1501.
RAO: "In-fibre Bragg grating sensors", Meas. Sci. Technol., vol. 8, No. 4, Apr. 1997, pp. 355-375.
Reimers et al. "Electrochemical and In Situ X-Ray Diffraction Studies of Lithium Intercalation in Li xCoO2", Journal of the Electrochemical Society, 139 (8), 1992.
Rodrigues et al. "A Review of State-of-Charge Indication of Batteries by Means of A.C. Impedance Measurements", Journal of Power Sources, vol. 87, 2000, pp. 12-20.
Sang et al. "Temperature-Insensitive Chemical Sensor Based on a Fiber Bragg Grating", Sensors and Actuators B 120, 2007, pp. 754-757.
Sethuraman et al. "Surface structural disordering in graphite upon lithium intercalation/deintercalation", Journal of Power Sources 195 (2010) 3655-3660.
Siegel et al. "Neutron Imaging of Lithium Concentration in FLP Pouch Cell Battery", Journal of the Electrochemical Society, 158 (6), 2011, 8 pages.
Smith et al. "Power and Thermal Characterization of a Lthium-Ion Battery Pack for Hybrid-Electric Vehicles", Journal of Power Sources, 160 (1), 2006, pp. 662-673.
Tang et al. "Measurement of Chloride-Ion Concentration with Long-Period Grating Technology", Smart Mater. Struct., vol. 16, 2007, pp. 665-672.
Triollet et al. "Discriminated measures of strain and temperature in metallic specimen with embedded superimposed long and short fibre Bragg gratings", Meas. Sci. Technol., vol. 22, No. 1, Jan. 2011, pp. 015202.
Udd et al. "Fiber Optic Distributed Sensing Systems for Harsh Aerospace Environments". Proc. SPIE 3674, Smart Structures and Materials 1999: Industrial and Commercial Applications of Smart Structures Technologies, 136 (Jul. 9, 1999) 12 pages.
Van Steenkiste et al. "Strain and Temperature Measurement with Fiber Optic Sensors", 1997, 9 pages.
Wang et al. "Simultaneous measurement of strain and temperature using dual-period fiber grating", Proc. SPIE, vol. 4579, 2001, pp. 265-268.
Wang et al. "Understanding Volume Change in Lithium-Ion Cells during Charging and Discharging Using In Situ Measurements", Journal of the Electrochemical Society, 154 (1), 2007.
Xu et al. "Discrimination between strain and temperature effects using dual-wavelength fibre grating sensors", Electron. Lett., vol. 30, No. 13, pp. 1085-1087, 1994.
Zhao et al. "Discrimination methods and demodulation techniques for fiber Bragg grating sensors", Opt. Lasers Eng., vol. 41, No. 1, pp. 1-18, Jan. 2004.
Zhou et al. "Simultaneous measurement for strain and temperature using fiber Bragg gratings and multimode fibers", Appl. Opt., vol. 47, No. 10, Apr. 2008, pp. 1668-1672.
File History for EP App. No. 15160672.0 as retrieved from the EP Electronic File System on Aug. 5, 2016, 106 pages.

* cited by examiner

METHOD FOR MONITORING/MANAGING ELECTROCHEMICAL ENERGY DEVICE BY DETECTING INTERCALATION STAGE CHANGES

STATEMENT REGARDING FEDERALLY SPONSORED RESEARCH AND DEVELOPMENT

This invention was made with government support under contract number ARPA DE-AR0000274, awarded by ARPA-E (Advanced Research Projects Agency-Energy). The U.S. Government has certain rights in this invention.

TECHNICAL FIELD

This application relates generally to techniques for monitoring and/or managing energy storage and/or power systems. The application also relates to components, devices, systems, and methods pertaining to such techniques.

BACKGROUND

With the rapidly evolving technology of the smart grid, hybrid (including plug-in hybrid) and plug-in electric vehicles (xEVs), rechargeable batteries have emerged as the most prominent electrochemical energy source. Electrochemical energy is the field of energy technology concerned with electrochemical methods of energy conversion and energy storage. Electrochemical energy conversion devices (e.g., fuel cells) generate electricity by converting the chemical energy from a fuel (e.g., hydrogen) through a chemical reaction with an oxidizing agent. Although many experts believe electrochemical conversion devices, such as fuel cells, will eventually replace rechargeable batteries as the most-used electrochemical energy device, electrochemical conversion devices are currently not economically feasible, and may not be for decades. Unlike electrochemical energy conversion devices, electrochemical energy storage devices (e.g., rechargeable batteries and supercapacitors) do not require a fuel supply, but must be periodically recharged in order to supply electricity. Although supercapacitors (aka, ultracapacitors) require much less time to charge than rechargeable batteries, rechargeable batteries store and supply far more energy, and are thus the most prominent electrochemical energy device in use today.

Smart grid and EV systems typically include management systems that utilize various sensors to monitor and control the operational state of an electrochemical energy system. For example, a conventional battery management system (BMS) is often utilized to process sensor information received from current, voltage and temperature sensors connected to multiple rechargeable batteries at different battery cell, battery module, and battery pack levels. The sensor data is processed to determine the condition of the battery system expressed by terms like (but not limited to) state-of-charge (SOC), -power (SOP), -health (SOH), capacity, impedance, structural integrity (electrode cracking and delamination), cell packaging and sealing, terminal voltage, temperature, pressure and strain. By processing the sensor data and initiating appropriate actions, the BMS not only controls the operational conditions of the battery to prolong its life and guarantee its safety (e.g., by disconnecting a battery cell to prevent the uncontrolled release of concentrated energy), but also provides accurate estimation of the SOC and SOH for energy management modules in the smart grid and xEVs.

Although conventional BMS approaches provided acceptable SOX information for conventional uses in portable electronics, there is a growing need for a more accurate and reliable BMS approach for today's smart grid and xEV systems. For example, accurate SOX information is very important in EV systems so that the BMS can control and utilize a pack within its true safe limits of operation to avoid degradation or failure. These operational limits depend on environmental conditions, age, and usage. It can also enable an xEV driver to know how much longer a vehicle will operate in electric mode before recharging and/or servicing. Current methods for determining SOC information in xEV systems rely on voltage and current measurements; voltage measurements can be "flat" (i.e., relatively unchanging) at certain intermediate charge levels. In addition, the correlation between voltage and SOC can change as cells age. These factors can lead to inaccurate SOC estimates. Similarly, conventional BMS systems typically determine a battery's SOH by way of estimating capacity drops, detecting unusual temperature, current and voltage changes. Although this approach may provide useful information near the end of a battery's lifetime (i.e., by detecting battery failure), it typically is not useful at predicting failure in advance, preventing degradation, or for tracking cell aging. Moreover, because rechargeable batteries are used in increasingly challenging environments, are required to provide greater power and energy densities, and are expected to have longer useful lifetimes, it is becoming even more difficult to generate reliable and accurate SOX information using conventional BMS methodologies.

Therefore, there is a clear need for an improved electrochemical energy device management system that employs improved methodologies capable of providing accurate SOC information during the entire charge cycle of the device, and capable of providing accurate SOP and SOH information throughout the device's operating lifetime. One way to provide improved SOX information is by way of monitoring internal battery phenomena such as the transport of charged and neutral species, current conduction, fluid flow, heat transfer, chemical reactions (including parasitic reactions) at the electrode surfaces, gas formation, material balance and phase transition, and the intercalation of ionic species into porous electrodes with associated momentum transfer. For example, in electrochemical energy devices that utilize intercalation compounds (guest species) to store energy, such as Li-ion rechargeable batteries or some supercapacitors, the electrode material typically undergoes crystalline structure "stage" changes during charging and discharging events (operations). These crystalline structure "stage" changes occur because the electrode material expands or contracts, respectively, as it accepts ions during charging, or loses (withdraws) ions during discharging. Intercalation stage transition points are repeatable, detectable events that occur within the electrode material with respect to charge/discharge states, and can be used to determine current (i.e., point-in-time) ion concentration levels within the electrode material. For example, certain graphite electrodes undergo five distinct crystalline structural changes over a charge cycle, as illustrated in FIG. 17, ranging from Stage 1 (fully charged) to Stage 5 (fully discharged).

Although the intercalation stage change phenomena can provide highly useful information for purposes of monitoring the SOX of an electrochemical energy storage device, the intercalation stage transition points cannot be measured directly by conventional methods like voltage, current and temperature measurements during runtime (i.e., during normal operating conditions), and existing methodologies require expensive equipment suitable only for laboratory settings. For example, currently identification of intercalation stages is performed primarily by slow scan rate cyclic voltammetry (SSCV), and potentiostatic intermittent titration (PITT) and electrochemical impedance spectroscopy (EIS) are also conducted in order to study the potentiodynamic behavior of batteries that are correlated to the intercalation stages. EIS provides a conventional approach for battery SOH estimation using intercalation stage information, but requires extensive prior calibration in the "healthy" condition, and also requires the battery to be in electrochemical equilibrium, and therefore is unsuitable for run-time monitoring. X-ray diffractometry and Fourier transform infrared (FTIR) spectroscopy are used in order to follow structural and surface chemical changes of battery electrodes under cycling, and Raman spectroscopy and atomic force microscopy (AFM) are also used for the structural characterization of materials used as electrodes in rechargeable lithium batteries. Other approaches for laboratory-level characterizations of internal cell state for model validation have included neutron radiography and optical microscopy in specially designed cells with quartz viewing windows. However, none of these methodologies are feasible outside a laboratory setting for use in full-time commercial applications, for example, such as monitoring the SOC and SOH of rechargeable batteries utilized to power xEVs.

What is needed is a low-cost, reliable system and method for detecting intercalation stage transition points of an electrode material within an electrochemical energy storage device. In particular, what is needed is a practical management system and management method for accurately determining the SOX (e.g., SOC and SOH) of electrochemical energy storage devices, such as rechargeable batteries utilized to power EVs, by way of measuring and recording such intercalation stage transition points.

SUMMARY

The present invention is directed to a method for operating (i.e., monitoring and/or managing) an electrochemical energy device (EED), such as a Lithium-ion battery, in which a guest species (e.g., Lithium ions) migrate between electrode materials during charge/discharge cycles in a manner that produces discrete intercalation stage change events. The method utilizes optical sensors (e.g., fiber Bragg grating sensors, etalon sensors, or Fabry-Perot sensors) to accurately measure operating parameter changes (e.g., minute strain and/or temperature changes that are associated with operating conditions of the EED during charge/discharge operations), and to transmit light signals including the measured parameter data to a control circuit. The control circuit utilizes a suitable detector that converts the light signals into electrical data signals, and a processor that analyzes the measured parameter data to identify present intercalation stage change events, and then uses the identified present intercalation stage change events to generate system management (e.g., charge/discharge control) signals and/or useful operating state information (e.g., state-of-charge (SOC), state-of-health (SOH), or state-of-power (SOP) information). By utilizing optical sensors, optical fibers and sensitive electronic circuitry to measure operating parameters, such as temperature changes or strain changes generated when the battery swells or contracts during charge/discharge cycling, the present invention provides a low-cost methodology for detecting intercalation stage changes that can be utilized, for example, in hybrid and electric vehicles to manage and optimize battery charge/discharge cycles, and to determine and display SOC information that is substantially more accurate than is possible using conventional methods. In addition, by analyzing the timing and duration of the intercalation stages, the present invention facilitates generating operating state and system management information that is substantially more accurate than is achievable using conventional methods.

According to a disclosed embodiment of the present invention, the method utilizes one or more optical sensors disposed to measure one or both of a mechanical strain parameter and a temperature parameter from the EED, wherein strain and/or temperature data measured by the optical sensor(s) is transmitted using light signals along one or more optical fibers to the control circuit. Although intercalation stage change events are detectable using either strain or temperature measurements, in a presently preferred embodiment both strain and temperature parameters are measured using at least two optical sensors, wherein the temperature measurements provide one or more of compensating data from the strain measurements and/or independent intercalation stage change event detection data. In one embodiment, both the strain (first) optical sensor and the temperature (second) optical sensor are disposed on a shared optical fiber (i.e., such that light signals light signals including both the measured strain and temperature parameter data are transmitted to the control circuit processor on the shared fiber using known techniques to minimize system costs.

According to alternative embodiments of the present invention, the method involves measuring operating parameters either from an external location (e.g., by mounting the optical fiber to an external surface of the EED's cell wall external locations of the EED, or from an internal location (e.g., by passing the optical fiber through the EED's cell wall). In one specific embodiment, two optical sensors are disposed on a single optical fiber that is operably attached to an external surface of the cell wall of the electrochemical energy device such that the optical sensors are configured to measure mechanical strain from the cell wall and an external temperature of the EED at the cell wall, respectively. In another specific embodiment, two optical sensors are disposed on an optical fiber that passes through the EED's cell wall such that the optical sensors are configured to measure mechanical strain from an internal surface (e.g., an inside surface of the cell wall or from an electrode material plate) and an internal temperature of the EED at the cell wall, respectively. In yet another embodiment, both external and internal sensors are utilized to measure both external and internal strain/temperature parameters.

According to a specific embodiment, the analyzer that receives the light signals transmitted on the optical fiber include a linear variable filter that is capable of resolving sub-picometer wavelength shifts to convert the light signals into electrical parameter data signals. The use of such a linear variable filter facilitates accurate detection and measurement of the minute parameter changes associated with intercalation stage changes.

According to an embodiment of the present invention, a present intercalation stage change is detected using a model-based estimation process that generates estimated "model-based" strain/temperature values based on previously measured strain/temperature values, and a detection/tracking process that compares the estimated strain/temperature values with present (most-recent) strain/temperature measurement values to detect the present intercalation stage change. The model-based estimation process then calculates a difference between the estimated and present strain/temperature values and generates/updates an intercalation stage transition point history, which is then used to determine either operating state information (e.g., state-of-charge (SOC) information and state-of-health (SOH) information), or charge/discharge control information. In one embodiment, the model-based estimation process effectively models the EED (e.g., a Lithium-ion battery) as a dynamical system that is influenced by the load current (the input), and responds with estimated strain and temperature values (the output). The model is initiated with an initial strain and temperature at time t=0, and compares for subsequent time instants the "present" (most-recently) measured strain and temperature data with the previous strain and temperature values, and then feeds the difference back in order to estimate internal battery states such as SOC that are not observed at the output, and to provide filtered updated estimates of the strain and temperature. In alternative embodiments, load current measurements are either used or not used in the model calculations. In one embodiment, the intercalation stage transition point history is analyzed to generate SOH values. In another embodiment, the model-based estimation process is based on a single model or a collection of models corresponding to each of the intercalation stages.

DESCRIPTION

Battery management systems that rely on external cell performance parameters to determine state-of-charge (SOC) and/or state-of-health (SOH) result in conservative overdesign to manage the uncertainty in battery state-of-charge and battery degradation with aging. This reliance on conservative overdesign of batteries has affected the widespread adoption of clean technologies such as electric vehicles and power grid storage. Conservative overdesign of batteries arises in part because the battery state cannot be fully understood from external parameters alone. This situation also applies to other types of energy storage devices and/or power generation systems where it is difficult to measure internal parameters.

The present invention is described below with specific reference to optically-based smart monitoring and management systems that determine SOC and SOH information in electrochemical energy storage devices utilizing guest species, such as Lithium-ion (Li-ion) rechargeable batteries. The monitoring and management systems disclosed herein enable comprehensive real-time performance management and reduce overdesign of power and/or energy systems utilizing such electrochemical energy storage devices. The monitoring and management systems disclosed herein utilize either external fiber optic sensors to detect external energy storage/power system parameters taken from an outer surface of a cell wall encasing the electrode material and guest species, internal sensors to detect internal energy storage/power system parameters from inside the cell wall, or a combination of external and internal sensors that provide both external and internal parameters. The outputs from the sensors are used by smart algorithms to determine state-of-charge (SOC) information by determining a most recent intercalation stage, and to make predictions such as state-of-health (SOH) and remaining useable energy of the energy storage system by detecting variations in intercalation stage onset and duration. Although the approaches disclosed herein are described with particular reference to electrochemical energy storage devices (e.g., rechargeable batteries and battery packs and supercapacitors), the approaches are also applicable to other electrochemical energy devices, such as fuel cell stacks, turbine-based power systems, and other types of energy storage and power generation devices and systems that utilize intercalation materials in the manner described herein.

Figure 1A:
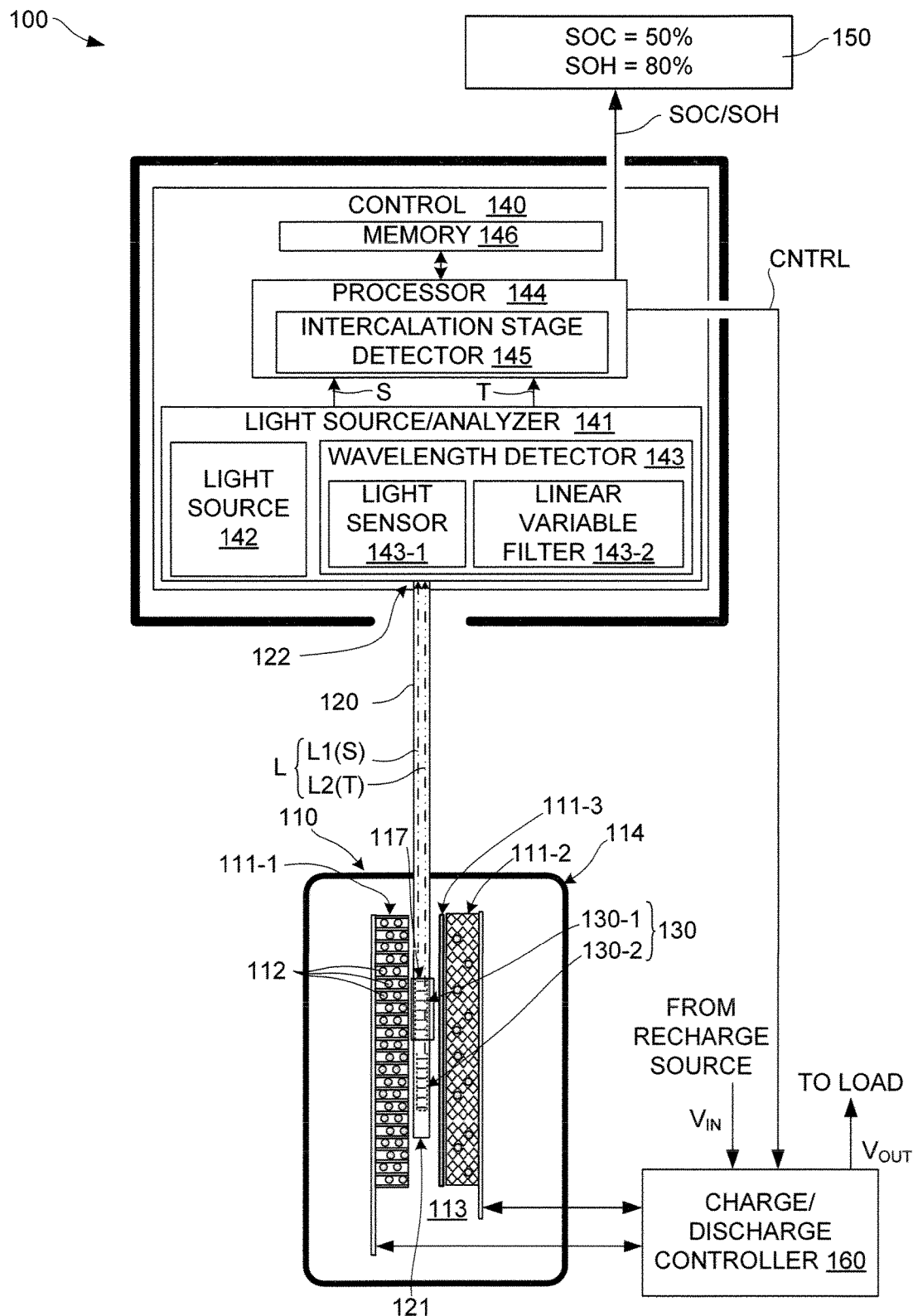
FIGS. 1(A), 1(B) and 1(C) are simplified block diagrams depicting monitoring and management systems according to generalized embodiments of the present invention.

Referring to the upper portion of FIG. 1(A), in the disclosed embodiment SOC and SOH information generated by processor 144 is provided to an operator via an electronic display 150. In alternative embodiments, the SOC and SOH information is generated using external strain/temperature parameters, internal strain/temperature parameters, or a combination of external and internal strain parameters. For example, processor 144 may compile, analyze, trend, and/or summarize the internal and/or external parameters, and/or may perform other processes based on the internal and/or external parameters, such as predicting and/or estimating the state of the energy storage/power system. The results of these processes and/or other information derived from monitoring the energy storage/power system may be provided in a report that can be displayed graphically or textually or in any convenient form to an energy storage/power system operator and/or may be provided to another computer system for storage in a database and/or further analysis. In alternative embodiments, processor 144 is implemented using a micro-processor configured to execute programming instructions consistent with the processes described herein, or one of a programmable logic device (e.g., a field programmable gate array) or an application specific integrated circuit that is configured using known techniques to implement the processes described herein. In this context, a "processor" should be understood in very general terms which may even include a smart display that allows extraction and visualization of the intercalation stages from the measured data.

FIG. 1(A) shows a simplified system 100 according to an exemplary embodiment of the present invention. System 100 generally includes an electrochemical energy device (EED) 110, at least one optical fiber 120, optical sensors 130-1 and 130-2, a control circuit 140, and an optional display 150.

According to an aspect of the present invention, EED 110 is of a type including anode electrode material layers 111-1, cathode electrode material layers 111-2, separator layers 111-3, a guest species 112, and an electrolyte 113 that are contained within an outer shell (cell wall) 114. For brevity, only one electrode "pair" (i.e., one anode layer 111-1 and one cathode layer 111-2) is shown in FIG. 1(A). EED 110 is characterized in that guest species 112 migrates between anode electrode material layers 111-1 and cathode electrode material layers 111-2 through an intervening membrane by way of an electrolyte 113, thereby causing crystalline structure "intercalation stage" changes in the electrode material "stack" formed by anode layers 111-1 and cathode layers 111-2 during charging and discharging events (operations). These crystalline structure "stage" changes occur because the electrode material stack expands or contracts, respectively, as it accepts guest species (ions) 112 (e.g., by anode layers 111-1 during charging), or loses (withdraws) guest species (ions) 112 (e.g., by anode layers 111-1 during discharging).

In a specific embodiment of the present invention, EED 110 is a Lithium-ion (Li-ion) rechargeable battery in which electrode material layers 111-1 and 111-2 are formed in stacks and comprise graphite and guest species 112 comprises Lithium-ions, and electrolyte 113 comprises $LiPF_6$ salt in an organic solvent. Li-ion batteries have gained a lot of interest in the past years, and are currently the most-used electrochemical energy storage device at this time because they offer big advantages compared to Ni—Cd, NI-MH and other common battery chemistries, such as particular high discharge rates and an exceptional high capacity. As a Li-ion battery is being cycled, a voltage applied between the anode and cathode leads to a movement of Li-ions 112. This voltage is usually applied in a way that the Li-ions are intercalated into the anode material stack 111-1 first. Intercalation is the reversible inclusion of a Li-ion in the crystallographic structure of each electrode material stack. Because the electrode material has a certain crystallographic structure, conditioned by the pursuit of energy minimization, the intercalation of Li-ions changes (usually increases) the interlayer spacing of the electrode material stack. The increase of the interlayer spacing leads to a small but measurable increase in the thickness of the electrode stack formed by anode electrode layers 111-1 and cathode electrode layers 111-2. Since a Li-ion battery usually consists of several stacked layers of cathode and anode material, the entire battery increases its thickness significantly during cycling. This phenomenon is known as electrode breathing. In the particular example of a Li-ion pouch cell, the growth of the electrode stack is translated in a lateral expansion of cell case (wall) 114. As set forth below, by detecting incremental changes in cell wall thickness and correlating those changes to stored data, the present invention facilitates the detection of intercalation change events.

Optical fiber 120 is an elongated thin transparent fiber made of high quality extruded glass (silica) or plastic that functions as a waveguide (or "light pipe") to transmit light between a first (e.g., end) portion 121 and a second portion 122. First portion 121 of optical fiber 120 is operably connected to EED 110 by way of a suitable connecting structure, and second portion 122 of optical fiber 120 is connected to control circuit 140. As such, optical fiber 120 is arranged to transmit operating parameter data from EED 110 to control circuit 140 in the form of light signals.

Optical sensors 130-1 and 130-2 are disposed on (i.e., formed on "functionalized" portions of or formed within the core (i.e., inscription of Bragg grating) of) optical fiber 120 using known techniques such that light transmitted along optical fiber 120 is affected by and reflected from optical sensors 130-1 and 130-2, respectively. In a presently preferred embodiment, optical sensors 130-1 and 130-2 are wavelength-encoded fiber sensors (such as Fiber Bragg Grating (FBG) sensors) in which the reflection spectrum (light wavelength) changes in response to an applied stimulus (e.g., temperature or strain) in the manner described in additional detail below with reference to FIGS. 3-6. Other types of optical sensors may be utilized, such as etalon or Fabry-Perot (FP) sensors, which together with FBG sensors are collectively referred to herein as fiber optic (FO) sensors. Optical sensors 130-1 and 130-2 are operably disposed on EED in a configuration that facilitates detecting (sensing) a strain parameter and a temperature parameter of EED 110. In the disclosed embodiment, optical sensor 130-1 is an FBG sensor formed by known techniques and located near portion 121 of optical fiber 120 that is connected (e.g., by using a bonding agent) to an external surface of cell wall (case) 114 by way of connector 117 such that optical sensor 130-1 is affected by mechanical strain of cell wall 114, whereby optical sensor 130-1 is configured to sense a strain parameter of EED 110 (e.g., the expansion or contraction of cell wall 114). In contrast, optical sensor 130-2 is an FBG sensor disposed on optical fiber 120 such that optical sensor 130-1 is affected by temperature variations of EED 110 (but not by strain), whereby optical sensor 130-2 is configured to sense an external temperature parameter of EED 110. As explained below, this arrangement facilitates the accurate measurement of changes in the thickness of the electrode stack, thereby facilitating the detection of intercalation stage changes.

Figure 1B:
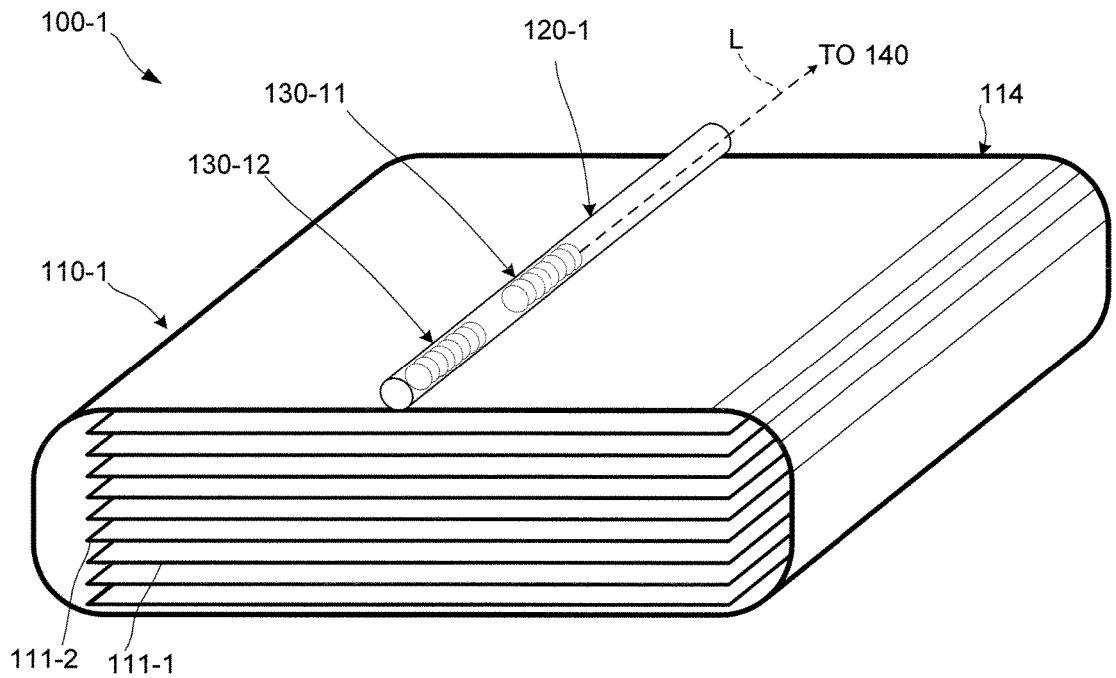
Figure 1C:
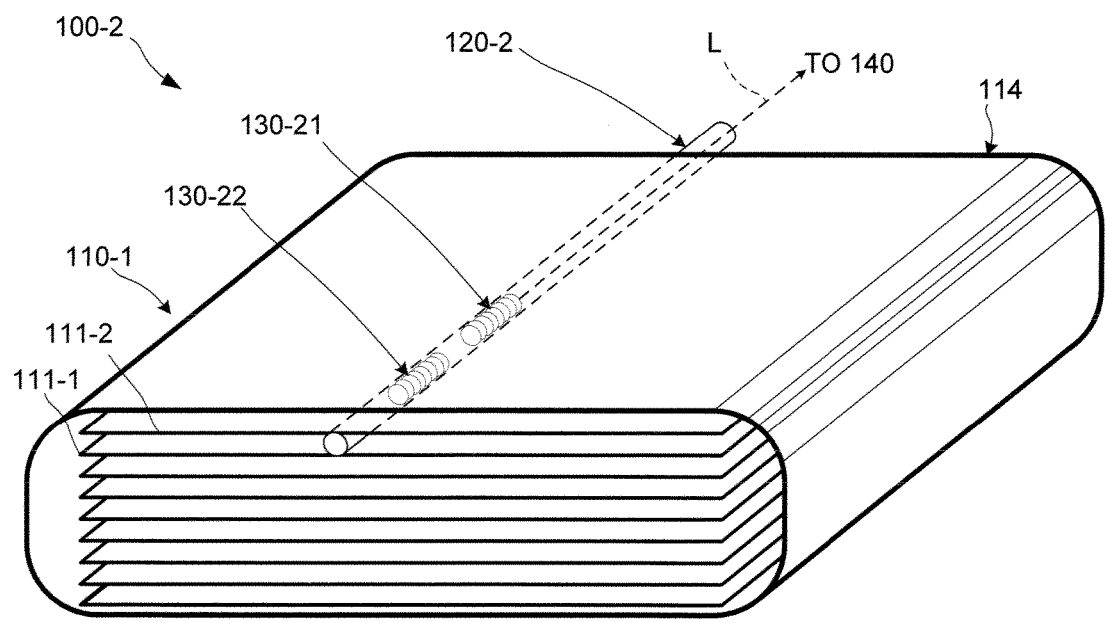

FIGS. 1(B) and 1(C) show alternative arrangements in which are arranged to measure either external operating parameters (e.g., from an external surface of cell wall 114), or internal operating parameters (i.e., from an internal location of EED 110 inside cell wall 114). FIG. 1(B) shows a first system 100-1 in which optical sensors 130-11 and 130-12 are disposed on optical fiber 120-1 that is operably attached to an external surface of cell wall 114 of EED 110-1, whereby optical sensor 130-11 is operably attached and configured to measure mechanical strain of cell wall 114, and optical sensor 130-12 is operably attached and configured to measure an external temperature of cell wall 114.

FIG. 1(C) shows an alternative system 100-2 in which optical sensors 130-21 and 130-22 are disposed on optical fiber 120-2 that extends through cell wall 114 of EED 110-2, with optical sensor 130-21 operably bonded to either an inside surface of cell wall 114 or to one of electrode layers 111-1 and 111-2 and configured to measure an internal mechanical strain of EED 110-2, and optical sensor 130-22 being operably attached and configured to measure an internal temperature of EED 110-2. In yet another embodiment (not shown), external sensors may be utilized in conjunction with one or more internal sensors to measure both internal and external operating parameters. In addition, one or more additional sensors may be utilized to measure other operating parameters of an EED. For example, internal optical sensors may be used measure one or more parameters such as vibration, ion concentration, or chemistry.

Referring to the upper center of FIG. 1(A), control circuit 140 includes light source/analyzer circuit 141, a processor 144 and memory 146 that function (i.e., are configured by appropriate hardware and software) to identify intercalation stage changes of FED 110 by analyzing at least one of strain data S and temperature data T generated by optical sensors 130-1 and 130-2 using the methodologies set forth below with reference to FIGS. 9 to 16.

Light source/analyzer circuit 141 is connected to (second) end portion 122 of optical fiber 120, and includes both a light source 142 and a wavelength detector (light sensing circuitry) 143 that operate in the manner described below with reference to FIGS. 7 and 8 to obtain strain and temperature parameter data. Briefly, light source 142 is controlled to transmit light having one or more wavelengths through optical fiber 120 to optical sensors 130-1 and 130-2, and wavelength detector 143 includes a light sensor 143-1 capable of receiving light signals L1(S) and L2(T) generated by optical sensors 130-1 and 130-2, and electronic circuitry for converting these light signals into an electrical strain data signal S and an electrical temperature data signal T, respectively. The light transmitted from light source 142 travels along optical fiber 120 and interacts with optical sensors 130-1 and 130-2 in a way that causes optical sensors 130-1 and 130-2 to generate reflected light signals L1(S) and L2(T), respectively, that are respectively affected (modulated) by strain and temperature parameters sensed (measured) at cell wall 114 such that wavelengths of the reflected light are different from those generated by light source by amounts proportional to distortions of optical sensors 130-1 and 130-2. In one embodiment, optical sensor 130-1 is mounted to cell wall 114 such that it is distorted in accordance with strain parameter changes (i.e., corresponding expansion/contraction of cell wall 114), whereby the wavelength of light signal L1(S) reflected from optical sensor 130-1 is modulated by these distortions to include corresponding strain parameter information (S). Similarly, optical sensor 130-2 is mounted to cell wall 114 such that it is distorted in accordance with temperature parameter changes (i.e., the temperature at cell wall 114), whereby the wavelength of light signal L2(T) reflected from optical sensor 130-2 is modulated by the sensor distortions to include corresponding temperature parameter information (T). The reflected light signals L1(S) and L2(T) travel back along optical fiber 120 to wavelength detector 141 for conversion into strain signal S and temperature signal T by wavelength detector 143, which then passes strain data signal S and temperature data signal T to processor 144. According to an aspect of the present invention, wavelength detector (light sensing circuitry) 143 utilizes a linear variable filter 143-2 to resolve sub-picometer wavelength shifts in light signals L1(S) and L2(T) in the manner described below with reference to FIGS. 7 and 8, and further disclosed in U.S. Pat. No. 8,594,470, entitled "Transmitting light with lateral variation", and in U.S. Pat. No. 8,437,582 entitled "Transmitting Light With Photon Energy Information", both incorporated herein by reference in their entirety. Detecting sub-picometer wavelength shifts in FO sensor signals by way of a compact, robust, and low-cost interrogation unit, such as linear variable filter 143, facilitates the detection of subtle features that may either not be detectable in coarser electrical signals, or are otherwise buried in electro-magnetic interference (EMI), whereby intercalation stage change detection is enhanced.

According to an aspect of the present invention, processor 144 is configured to function, in part, as an intercalation stage change detector 145 that detects (identifies) intercalation stage changes of EED 110 by analyzing parameter data associated with at least one operating parameter (e.g., strain data signals S and temperature data signals T). As mentioned above and described in additional detail below, the intercalation stage changes are caused by migration of the guest species 112 between electrode material layers 111-1 and 111-2. In specific embodiments described below, intercalation stage change detector 145 detects intercalation stage change events within Li-ion batteries by analyzing present (most recently measured) strain data S and/or temperature data T using a model-based process that generates estimated parameter values from previously received strain/temperature data, which may be stored in a memory 146, and compares the estimated values with the actual values to detect characteristic strain/temperature changes associated with the various intercalation stage change events that occur during charge and discharge cycles of EED 110. Processor 140 then processes the detected intercalation stage change information to determine operating state (e.g., SOC and/or SOH) information, which is then transmitted to a display 150 for visual presentation to user (e.g., the driver of an xEV). Alternatively (or in addition), processor 140 generates control information signals CNTRL in accordance with the detected intercalation stage changes that are utilized to control at least one of a charging rate and a discharging rate of EED 110 during charge/discharge cycling (i.e., normal operating periods) by way of a charge/discharge controller 160.

Figure 2:
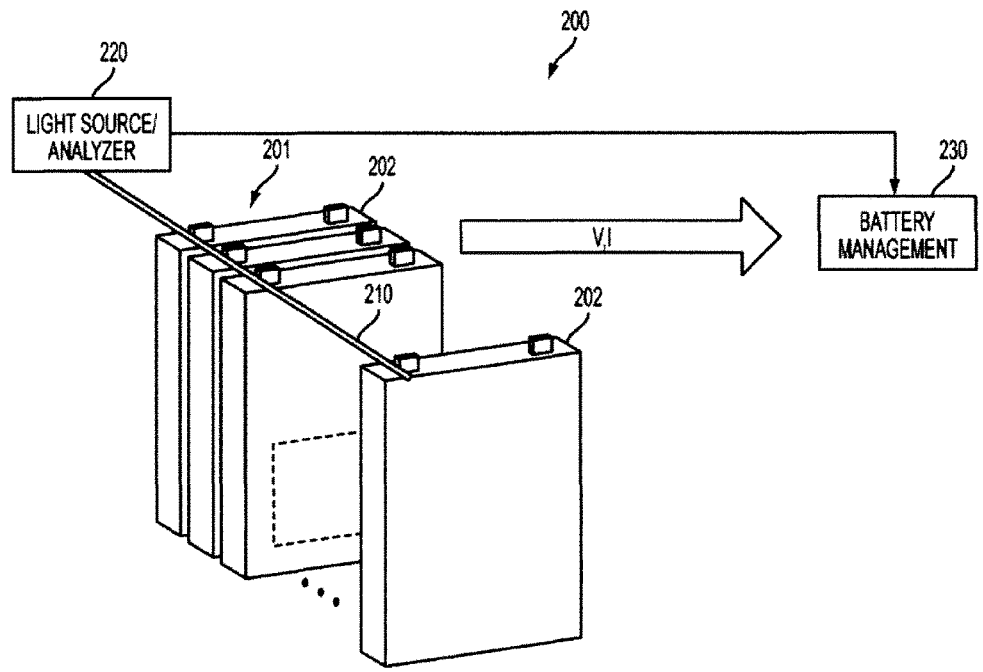
FIG. 2 depicts a block diagram of a monitoring and management system for a battery.

FIG. 2 illustrates a battery 201 that is monitored and/or managed by a battery monitoring and management system (BMMS) 200 according to an alternative embodiment of the present invention. The monitoring portion of the BMMS comprises a number of multiplexed FBG sensors (not shown) embedded within or disposed on cells 202 of battery 201 and disposed on a single optical fiber (FO) cable 210. BMMS system 200 may include one or more FO cables, where each FO cable includes multiple optical sensors that are arranged in a manner similar to that described above with reference to FIG. 1(A). In various implementations, the strain and temperature parameters of battery 201 as a whole, e.g., average parameters across multiple cells, and/or strain/temperature parameters of one or more of the battery cells can be monitored. In addition to strain and temperature, a non-limiting illustrative set of additional parameters that may be monitored by the sensors includes one or more of stress, internal pressure, ion concentration, and/or chemical composition or concentration.

The BMMS 200 includes a light source/analyzer 220 coupled to the FO cable 210. Although one light source/analyzer 220 is shown in FIG. 2, in some configurations multiple light source/analyzers may be respectively coupled to multiple FO cables that include multiplexed optical sensors.

Light from the light source/analyzer 220 is transmitted through the FO cable 210 where the transmitted light interacts with the FBG sensors that are spaced apart along the FO cable 210. Reflected light signals including temperature and strain data are detected and analyzed by the detector/analyzer portion of the light source/analyzer 220. In some implementations, the voltage and/or current of the battery 201 and/or other external battery parameters may also be measured and provided to the battery management processor 230.

The FBG sensors utilized in system 200 are similar to those described above with reference to FIG. 1(A), and are formed by a periodic modulation of the refractive index along a finite length (typically a few mm) of the core of the FO cable. This pattern reflects a wavelength, called the Bragg wavelength that is determined by the periodicity of the refractive index profile of the FBG sensor. In practice, the sensor typically reflects a narrow band of wavelengths centered at the Bragg wavelength. The Bragg wavelength at a characteristic or base value of the external stimulus is denoted λ and light having wavelength λ (and a narrow band of wavelengths near λ) are reflected when the sensor in the base condition. For example, the base condition may correspond to 25° C. and/or zero strain. When the sensor is subjected to an external stimulus, such as temperature, strain, or other such stimulus, the stimulus changes the periodicity of the grating and the index of refraction of the FBG, and thereby alters the reflected wavelength to a wavelength, $\lambda_s$, different from the base wavelength, λ. The resulting wavelength shift, $\Delta\lambda/\lambda = (\lambda - \lambda_s)/\lambda$ is a direct measure of the stimulus.

The relation between wavelength shift ($\Delta\lambda/\lambda$) and simultaneous strain and temperature in an FBG sensor is:

$$\Delta\lambda/\lambda = \{1 - n^2/2[p_{12} - n(p_{11} + p_{12})]\}\in_1 + [\alpha + 1/n(dn/dT)]\Delta T \quad [1]$$

where n is the index of refraction, $p_{11}$ and $p_{12}$ are strain-optic constants, $\in_1$, is longitudinal strain, α is the coefficient of thermal expansion and T is the temperature. In some implementations, by using multiple FBG sensors that are differently affected by strain and temperature (due to design or mounting), dual fibers or special FBG sensors in combination with data evaluation algorithms, the impacts from strain and temperature on the wavelength shift can be separated.

Examining the response of FBG sensors quantified in Equation [1], it is clear that these sensors are sensitive to changes in refractive index n, strain $\in_1$, and ambient temperature changes ΔT. The refractive index n can be made sensitive to the chemical environment of the sensor by stripping the FO cladding over the sensor element region and/or by adding appropriate coatings to this sensitive area. Alternately, FBG sensors can be made sensitive to the chemical environment by applying special coatings that convert the chemical composition of the environment into a strain signal (e.g. hydrogen sensors based on palladium coatings). According to embodiments discussed herein, optical sensors such as FBG sensors are used to detect chemical composition changes in battery cells that might affect performance. An example of this is formation of a corrosive agent, hydrogen fluoride (HF), in Li-ion cells caused by moisture penetration.

The sensitivity of FBGs to temperature changes allows local temperatures within battery cells to be monitored. While this is useful in general for battery system management, it is particularly beneficial for early detection of thermal runaways. Thermal runaways affect many battery chemistries and can be devastating in Li-ion cells due to their high energy density. During a thermal runaway, the high heat of the failing cell can propagate to the next cell, causing it to become thermally unstable as well. In some cases, a chain reaction occurs in which each cell disintegrates at its own timetable. A pack of battery cells can be destroyed within a few seconds or can linger on for several hours as each cell is consumed one-by-one.

The sensitivity of the FBG sensors to strain allows embedding FBG sensors into battery electrodes to monitor the expansion/contraction cycles of the electrodes (which is useful for estimating charge levels, e.g. in Lithium-ion cells). Additionally, electrode strain measurements allow for examining the degradation of the electrodes, and thus the overall degradation of the battery. FBG sensitivity to strain also allows measurement of internal cell pressure by capturing cell wall strains.

In measuring power supply parameters using FBG sensors, it can be beneficial to distinguish between and quantify the individual contributions of the multiple parameters of interest. In some cases, a multi-sensor configuration may be used so that the parameter of interest can be compensated for the contributions of other parameters. For example, a two-sensor approach may be used for temperature-compensated chemical sensing, where the two sensors can be arranged in close proximity. In some implementations, a first sensor of the two sensors is exposed to temperature and is also exposed to the chemical environment by stripping its cladding. A second sensor of the two sensors used for compensation retains its cladding and is only sensitive to temperature. Similar configurations may be used for temperature-compensated strain measurements and strain-compensated temperature measurements.

For temperature-compensated strain measurements, two FBG sensors are placed in close proximity (e.g., as indicated by optical sensors 130-1 and 130-2 in FIG. 1(A)), where the first sensor is exposed to strain and temperature and a second sensor used for compensation is exposed to temperature but not strain. In one embodiment, the temperature measurement of the second sensor is used to compensate for changes in temperature in the strain measurement of the first sensor. For example, the first sensor may be placed within an electrode or cell wall of a battery and the second sensor may be placed nearby and/or at a location having about equal temperature as the location of the first sensor while being subjected to a known and/or non-varying strain. For example, the second sensor may be located near but not within the electrode or cell wall. As described below, in another embodiment the temperature measurement of the second sensor may also be utilized to identify intercalation stage changes independently, or correlated with strain measurements to identify intercalation stage changes.

Fiber optic sensors have been demonstrated to withstand and perform in various harsh environments. The most common material used is silica, which is corrosion resistant, can withstand high tensile strain, and can survive between −200° C. and 800° C. Silica-based FBG sensors provide repeatable dependency of their peak wavelength with temperature consistently with no thermal hysteresis in tests done up to 300° C. It is expected that FBG sensors will survive long-term (13-25 years) in lead acid batteries and at least up to a year in HF (a side product of Li-ion batteries: one year is expected to be longer than the life of the Li-ion battery after HF formation begins). Various types of plastics are also useful for FO cables and optical sensors. Fiber optic sensors such as FBG sensors and etalon (FP) sensors are robust with respect to shock and vibration. Thus, embedded fiber optic sensors in energy storage/power systems such as batteries offer an attractive solution to reliably measure and monitor relevant parameters across various architectures and chemistries.

Figure 3:
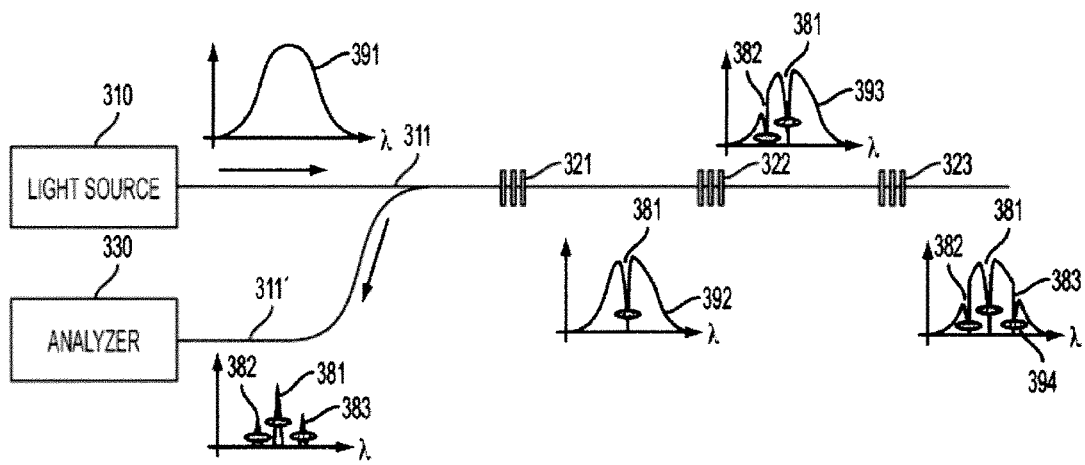
FIG. 3 illustrates reflected spectra for fiber Bragg grating (FBG) sensors used in a power supply sensing and management system.

FBG-based sensing allows for incorporating multiple sensing elements, e.g., about 64 sensors, on a single FO cable. Each of the sensors can be individually interrogated through multiplexing, e.g., wavelength division multiplexing (WDM) or optical time division multiplexing (TDM). One special implementation of wavelength division multiplexing for multiple sensors is illustrated in FIG. 3. A broadband light source 310 is used along with multiple FBG sensors 321-323. Each of the FBG sensors 321-323 are tuned to be primarily reflective to light at different wavelength bands and are deployed on the same optical fiber spaced apart from each other along the FO cable and at different distances from the light source 310. Each FBG sensor is designated to measure a different parameter or combination of parameters. The wavelength shifts caused by changes in the sensed parameters are small compared to the spacing between the characteristic base wavelengths of the individual FBGs. Therefore, it is feasible to separate the information from the different FBGs using linear variable filters or dispersive elements in an optical WDM scheme. Alternately, an optical TDM scheme can be implemented that operates by transmitting a train of short pulses of light in the FO cable, where the wavelengths of the light pulses differ from one another and selectively address the various FBG sensors along the FO cable.

FIG. 3 illustrates a monitoring system that monitors multiple parameters of an energy storage/power system with sensor outputs multiplexed using optical WDM. As indicated in FIG. 3, broadband light is transmitted by the light source 310, which may comprise or be a light emitting diode (LED) or superluminescent laser diode (SLD), for example. The spectral characteristic (intensity vs. wavelength) of the broadband light is shown by inset graph 391. The light is transmitted via the FO cable 311 to the first FBG sensor 321. The first FBG sensor 321 reflects a portion of the light in a first wavelength band having a central or peak wavelength, $\lambda_1$. Light having wavelengths other than the first wavelength band is transmitted through the first FBG sensor 321 to the second FBG sensor 322. The spectral characteristic of the light transmitted to the second FBG sensor 322 is shown in inset graph 392 and exhibits a notch at the first wavelength band centered at $\lambda_1$ indicating that light in this wavelength band is reflected by the first sensor 321.

The second FBG sensor 322 reflects a portion of the light in a second wavelength band having a central or peak wavelength, $\lambda_2$. Light that is not reflected by the second FBG sensor 322 is transmitted through the second FBG sensor 322 to the third FBG sensor 323. The spectral characteristic of the light transmitted to the third FBG sensor 323 is shown in inset graph 393 and includes notches centered at $\lambda_1$ and $\lambda_2$.

The third FBG sensor 323 reflects a portion of the light in a third wavelength band having a central or peak wavelength, $\lambda_3$. Light that is not reflected by the third FBG sensor 323 is transmitted through the third FBG sensor 323. The spectral characteristic of the light transmitted through the third FBG sensor 323 is shown in inset graph 394 and includes notches centered at $\lambda_1$, $\lambda_2$ and $\lambda_3$.

Light in wavelength bands 381, 382, 383, having central wavelengths $\lambda_1$, $\lambda_2$ and $\lambda_3$ (illustrated in inset graph 395) is reflected by the first, second, or third FBG sensors 321, 322, 323, respectively, along the FO cables 311 and 311' to the analyzer 330. The analyzer 330 may compare the shifts in each the central wavelengths $\lambda_1$, $\lambda_2$ and $\lambda_3$ and/or wavelength bands reflected by the sensors 321-323 to a characteristic base wavelength (a known wavelength) to determine whether changes in the parameters sensed by the sensors 321-323 have occurred. The analyzer may determine that the one or more of the sensed parameters have changed based on the wavelength analysis and may calculate a relative or absolute measurement of the change.

In some cases, instead of emitting broadband the light source may scan through a wavelength range, emitting light in narrow wavelength bands to which the various sensors disposed on the FO cable are sensitive. The reflected light is sensed during a number of sensing periods that are timed relative to the emission of the narrowband light. For example, consider the scenario where sensors 1, 2, and 3 are disposed on a FO cable. Sensor 1 is sensitive to a wavelength band (WB1), sensor 2 is sensitive to wavelength band WB2, and sensor 3 is sensitive to WB3. The light source may be controlled to emit light having WB1 during time period 1 and sense reflected light during time period 1a that overlaps time period 1. Following time period 1a, the light source may emit light having WB2 during time period 2 and sense reflected light during time period 2a that overlaps time period 2. Following time period 2a, the light source may emit light having WB3 during time period 3 and sense reflected light during time period 3a that overlaps time period 3. Using this version of TDM, each of the sensors may be interrogated during discrete time periods.

The FO cable used for energy storage/power system monitoring may comprise a single mode (SM) FO cable (as depicted in FIG. 3) or may comprise a multi-mode (MM) FO cable. While single mode fiber optic cables offer signals that are easier to interpret, to achieve broader applicability and lower costs of fabrication, multi-mode fibers may be used.

MM fibers may be made of plastic rather than silica, which is typically used for SM fibers. Plastic fibers may have smaller turn radii when compared with the turn radii of silica fibers, thereby making plastic fibers more practical to embed into battery cells and in individual cells of fuel cell stacks, for example. Furthermore, MM fibers can work with less expensive light sources (e.g., LEDs) as opposed to SM fibers that may need more precise alignment with superluminescent diodes (SLDs). Therefore, sensing systems based on optical sensors in MM fibers are expected to yield lower cost systems.

Figure 4:
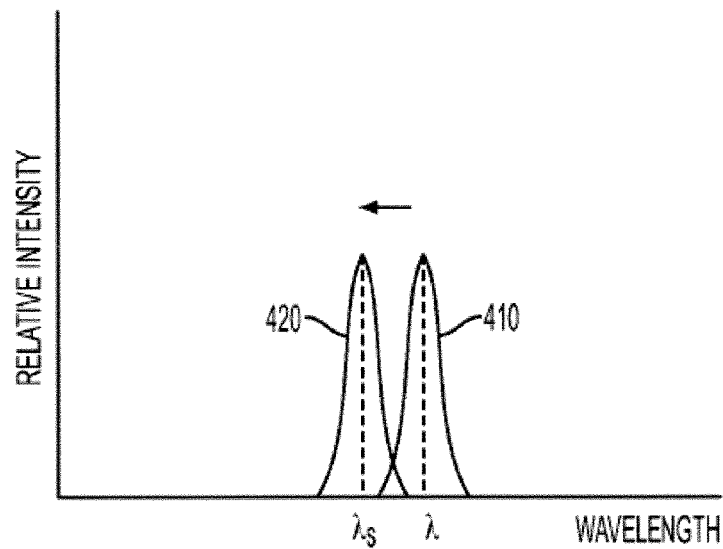
FIG. 4 depicts an idealized shift in the wavelength spectrum for a FBG sensor deployed on a single mode fiber cable.

FIG. 4 is an idealized representation of light reflected from a FBG sensor deployed on a SM FO cable. In the characteristic base or known state, the FBG sensor reflects light in a relatively narrow wavelength band 410 having a central or peak wavelength, $\lambda$. After the FBG sensor experiences a change in the sensed condition, e.g., a change in temperature, strain, chemical environment, the light reflected by the sensor shifts to a different wavelength band 420 having a central wavelength $\lambda_s$. Wavelength band 420 is similar in width, amplitude and other morphological characteristics when compared to wavelength band 410, but the central wavelength, $\lambda_s$, of wavelength band 420 is shifted 430 from the central wavelength, $\lambda$, of wavelength band 410 by an amount that is related to the change in the sensed condition. Wavelength bands of similar widths can be identified as wavelength bands having similar full width half maximum (FWHM) values, for example.

Figure 5:
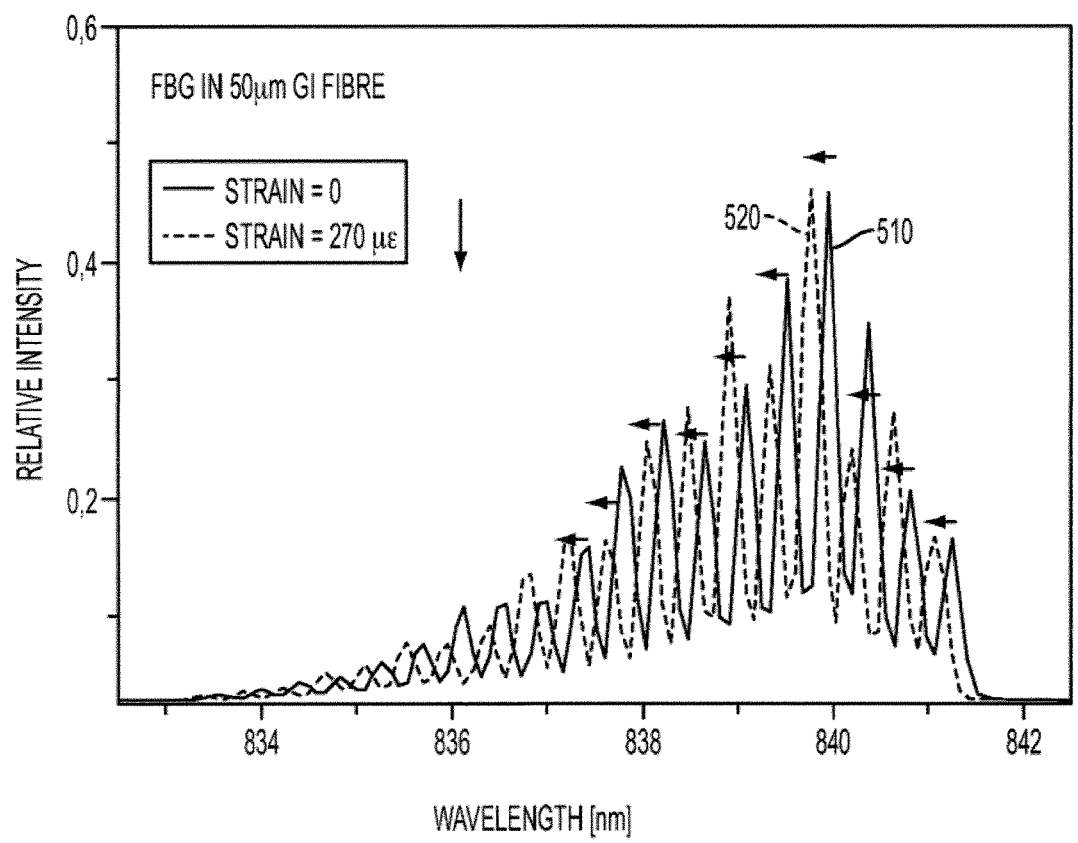
FIG. 5 depicts the shift in the wavelength spectrum for a FBG sensor deployed on a multi-mode fiber optic cable.

FIG. 5 depicts actual data from an FBG sensor deployed on a MM FO cable. FBG sensors deployed on MM FO cables reflect light in multiple wavelength bands in contrast to FBG sensors on SM FO cable where only one wavelength band is reflected by the grating. In the characteristic base condition, the sensor reflects a characteristic spectrum that may include multiple narrower wavelength bands (also referred to as modes) as shown in graph 510.

Figure 6:
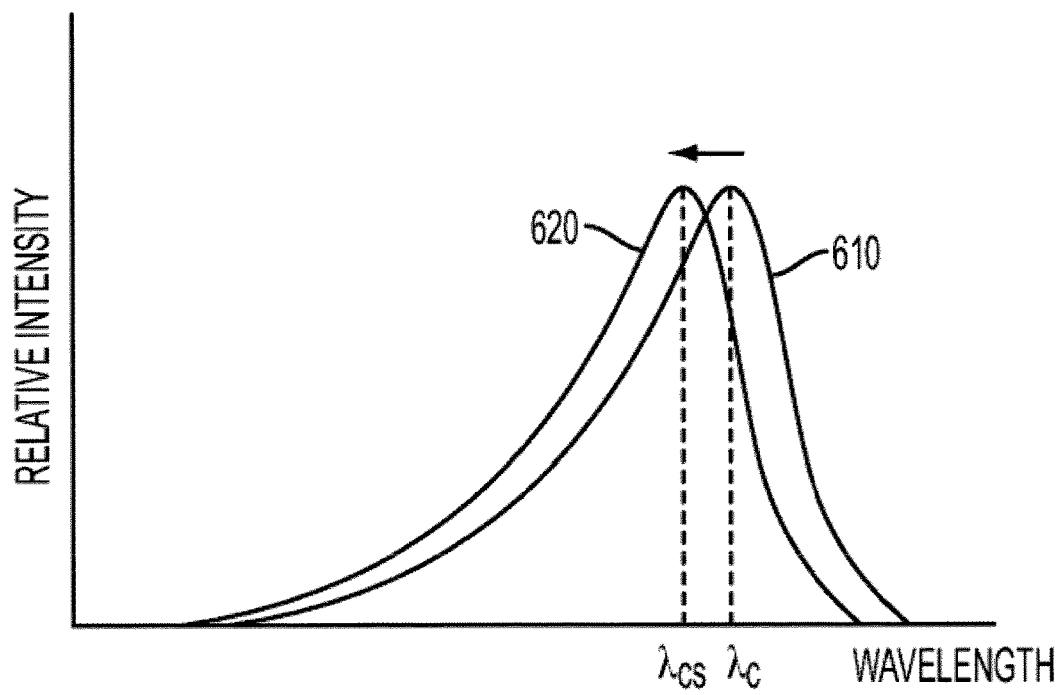
FIG. 6 depicts the shift in the wavelength spectrum modulated envelope of the FBG sensor of FIG. 5.

When a change in the sensed parameter occurs, the reflected wavelength spectrum 520 substantially maintains its shape, but is shifted in wavelength in response to the sensed condition. Analyzers discussed herein are particularly suited to interrogate MM FBG sensors because these analyzers detect the spectrum centroid (central value of the wavelength spectrum modulated envelope) rather than the shift of the individual modes. FIG. 6 shows the base wavelength spectrum modulated envelope 610 of the base wavelength spectrum 510 representing the reflected light when the FBG sensor is in the base condition. The envelope 610 may be characterized by a central or peak wavelength, $\lambda_c$, and a FWHM value. When exposed to the sensed condition, the reflected wavelength spectrum modulated envelope 620 of wavelength spectrum 520 shifts to a new central or peak wavelength, $\lambda_{cs}$. The envelope 620 may be characterized by a FWHM value and the central or peak wavelength, $\lambda_{cs}$. The FWHM value of the shifted 620 envelope may remain substantially unchanged from the base FWHM value, however the central or peak wavelength, $\lambda_{cs}$, is shifted from the base central wavelength, $\lambda_c$, by an amount related to the change in the sensed parameter.

Figure 7:
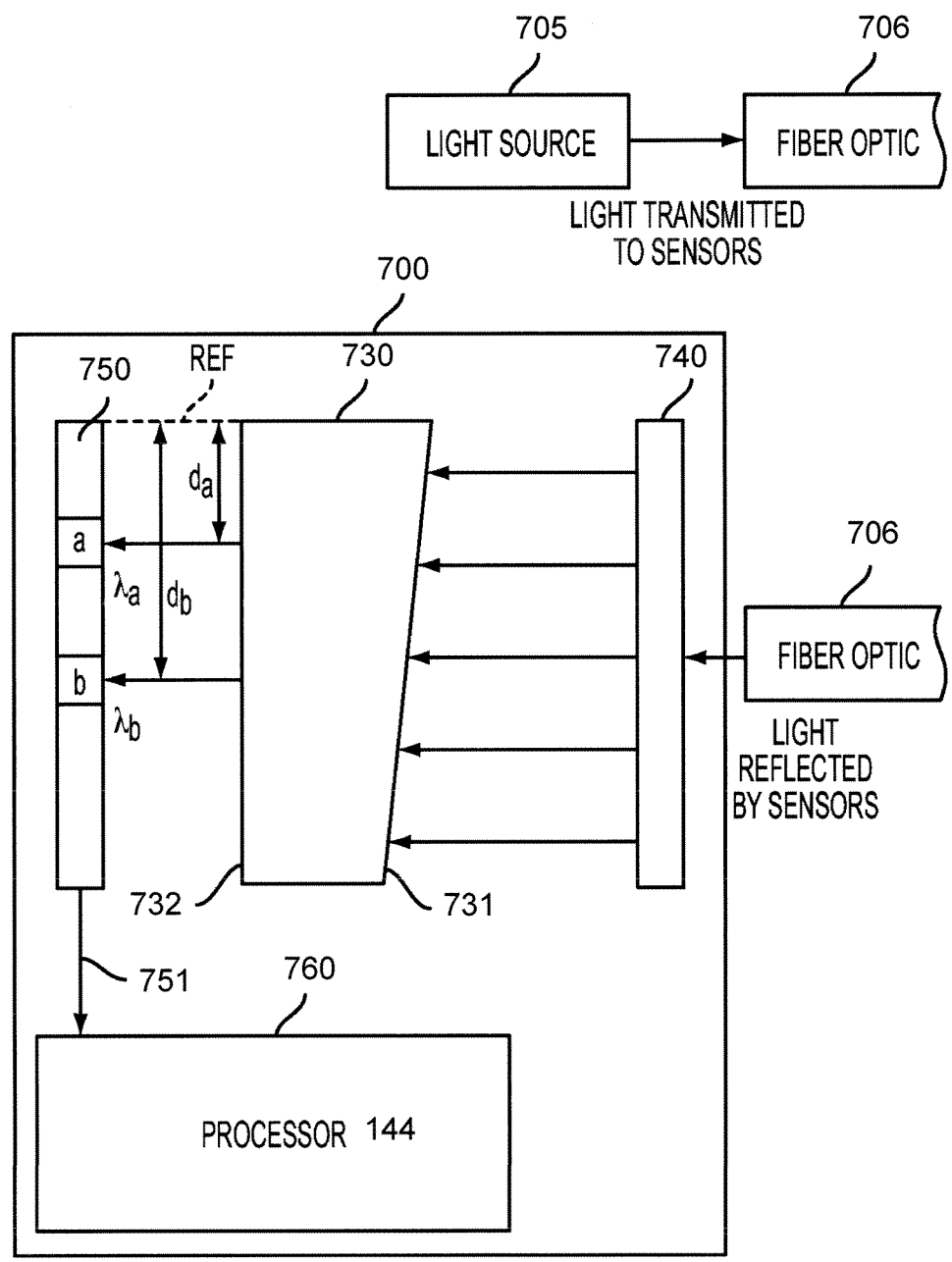
FIG. 7 is a block diagram depicting portions of an analyzer used to detect spectral changes in fiber sensor output signal.

FIG. 7 is a block diagram illustrating portions of a light source/analyzer 700 that may be used to detect and/or interpret optical signals received from an MM or SM FO cable having multiple optical sensors arranged at locations in, on or about an energy storage/power system (e.g., light source/analyzer 700 is utilized to implement light source/analyzer 141 in the embodiment of FIG. 1(A)). The light source 705 transmits input light to the sensors via FO 706. The analyzer 700 includes various components that may optionally be used to analyze the light reflected by the sensors and propagated by FO 706. The analyzer 700 includes an optional spreading component 740 configured to collimate and/or spread the light from the FO cable 706 across an input surface of a linearly varying transmission structure (LVTS) 730. In arrangements where sufficient spreading of the light occurs from the FO, the spreading component may not be used. The LVTS 730 may comprise a dispersive element, such as a prism, or linear variable filter. The LVTS 730 receives light at its input surface 731 (from the FO 710 and (optionally) the spreading component 740) and transmits light from its output surface 732. At the output surface 732 of the LVTS 730, the wavelength of the light varies with distance along the output surface 732. Thus, the LVTS 730 can serve to demultiplex the optical signal incident at the input surface 731 of the LVTS 730 according to the wavelength of the light. FIG. 7 shows two wavelength bands (called emission band) emitted from the LVTS 730, a first emission band has a central wavelength of $\lambda_a$ emitted at distance $d_a$ from a reference position (REF) along the output surface 732. The second emission band has a central wavelength $\lambda_b$ and is emitted at distance $d_b$ from the reference position. A position sensitive detector (PSD) 750 is positioned relative to the LVTS 730 so that light transmitted through the LVTS 730 falls on the PSD. For example, light having wavelength $\lambda_a$ falls on region a of the PSD 750 and light having wavelength $\lambda_b$ falls on region b of the PSD 750. The PSD generates an electrical signal along output 751 that includes information about the position (and thus the wavelength) of the light output from the LVTS. The output signal from the PSD is used by the processor 760 to detect shifts in the wavelengths reflected by the sensors.

The PSD may be or comprise a non-pixelated detector, such as a large area photodiode, or a pixelated detector, such as a photodiode array or charge coupled detector (CCD). Pixelated one-dimensional detectors include a line of photosensitive elements whereas a two-dimensional pixelated detector includes an n×k array of photosensitive elements. Where a pixelated detector is used, each photosensitive element, corresponding to a pixel, can generate an electrical output signal that indicates an amount of light incident on the element. The processor 760 may be configured to scan through the output signals to determine the location and location changes of the transmitted light spot. Knowing the properties of the LVTS allows determining peak wavelength(s) and shift of the peak wavelength(s) of the first and/or second emission band. The wavelength shift of the first or second emission band can be detected as a shift of the transmitted light spot at location a or b. This can, for example, be accomplished by determining the normalized differential current signal of certain pixels or pixel groups of the PSD.

For example, consider the example where light spot A having emission band $EB_A$ is incident on the PSD at location a. $I_{a1}$ is the current generated in the PSD by light spot A by pixel/pixel group at location a1 and $I_{a2}$ is the current generated in the PSD by light spot A by pixel/pixel group at location a2. Light spot B having emission band $EB_B$ is incident on the PSD at location b. $I_{b1}$ is the current generated in the PSD by light spot B by pixel/pixel group at location b1 and $I_{b2}$ is the current generated in the PSD by light spot B by pixel/pixel group at location b2.

The normalized differential current signal generated by pixels or pixel groups at locations a1 and a2 can be written $(I_{a1}-I_{a2})/(I_{a1}+I_{a2})$, which indicates the position of light spot A on the PSD. The wavelength of $EB_A$ can be determined from the position of light spot A on the PSD.

Similarly, the normalized differential current signal generated by pixels or pixel groups at locations b1 and b2 can be written $(I_{b1}-I_{b2})/(I_{b1}+I_{b2})$, which indicates the position of light spot B on the PSD. The wavelength of $EB_B$ can be determined from the position of light spot B on the PSD.

Figure 8:
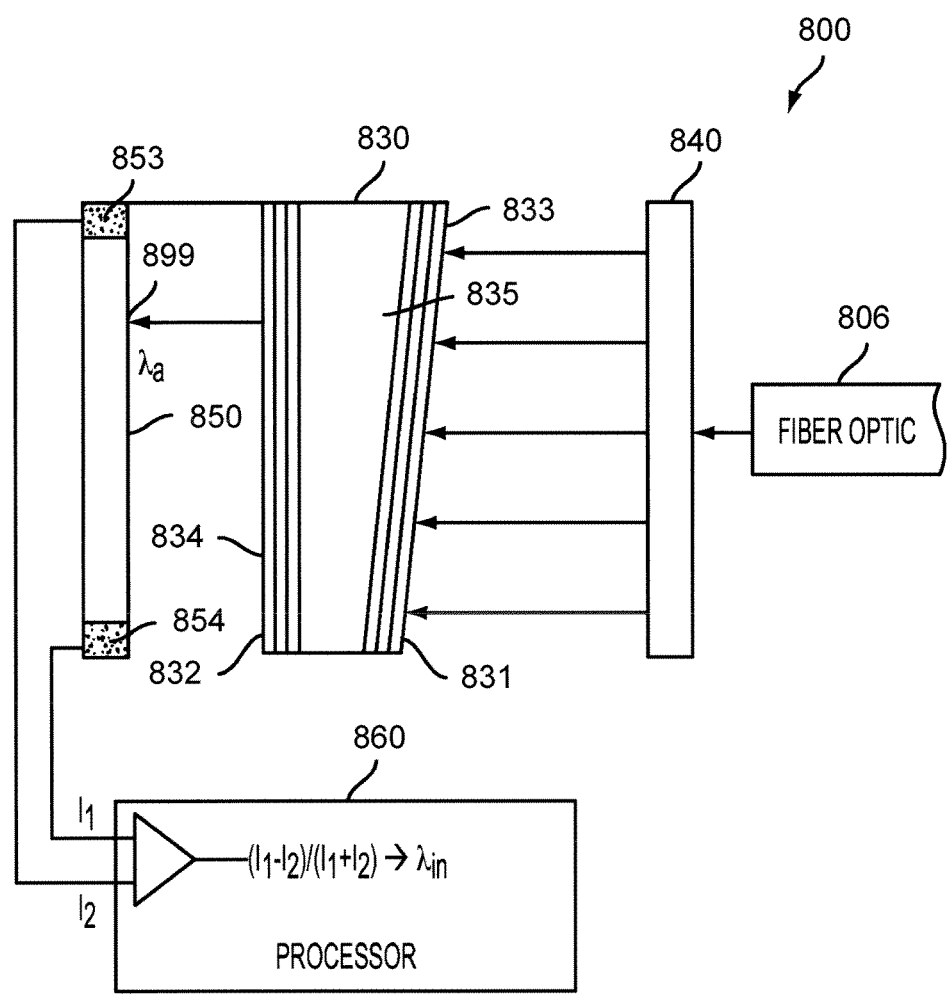
FIG. 8 is a block diagram depicting portions of an analyzer that uses a non-pixelated photosensitive detector.

FIG. 8 is a block diagram illustrating portions of an analyzer 800 that includes a non-pixelated, one-dimensional PSD 850 that may also be utilized in the embodiment of FIG. 1(A). The analyzer 800 includes an optional spreading component 840 that is similar to spreading component 740 as previously discussed. The spreading component 840 is configured to collimate and/or spread the light from the FO cable 806 across an input surface 831 of a linearly varying transmission structure (LVTS) 830. In the implementation depicted in FIG. 8, the LVTS 830 comprises a linear variable filter (LVF) that comprising layers deposited on the PSD 850 to form an integrated structure. The LVF 830 in the illustrated example comprises two mirrors, e.g., distributed Bragg reflectors (DBRs) 833, 834 that are spaced apart from one another to form optical cavity 835. The DBRs 833, 834 may be formed, for example, using alternating layers of high refractive index contrast dielectric materials, such as $SiO_2$ and $TiO_2$. One of the DBRs 833 is tilted with respect to the other DBR 834 forming an inhomogeneous optical cavity 835. It will be appreciated that the LVF may alternatively use a homogeneous optical cavity when the light is incident on the input surface at an angle.

The PSD 850 shown in FIG. 8 is representative of a non-pixelated, one-dimensional PSD although two-dimensional, non-pixelated PSDs (and one or two-dimensional pixelated PSDs) are also possible. The PSD 850 may comprise, for example, a large area photodiode comprising a semiconductor such as InGaAs. Two contacts 853, 854 are arranged to run along first and second edges of the semiconductor of the PSD to collect current generated by light incident on the surface of the PSD 850. When a light spot 899 is incident on the PSD 850, the contact nearest the light spot collects more current and the contact farther from the light spot collects a lesser amount of current. The current from the first contact 853 is denoted $I_1$ and the current from the second contact 854 is denoted $I_2$. The processor 860 is configured to determine the normalized differential current, $(I_1-I_2)/(I_1+I_2)$, the position of the transmitted light spot, and therefore the predominant wavelength of the light incident at the input surface 831 of the LVTS 830 can be determined. The predominant wavelength may be compared to known wavelengths to determine an amount of shift in the wavelength. The shift in the wavelength can be correlated to a change in the sensed parameter. In case two emission bands (creating two spatially separated light spots) hitting the detector at the same time the detector is only capable to provide an average wavelength and wavelength shifts for both emission bands. If wavelength and wavelengths shift of both emission bands need to be determined separately the two emission bands need to hit the detector at different time (time multiplexing).

In other embodiments, a two dimensional non-pixelated PSDs may be used, with edge contacts running along all four edges. The position of the central reflected wavelength may be determined by analyzing the current collected from each of the four contacts. The portion of the analyzer shown in FIG. 8 may be packaged together in a suitable housing, e.g., TO5 transistor header.

Figure 9A:
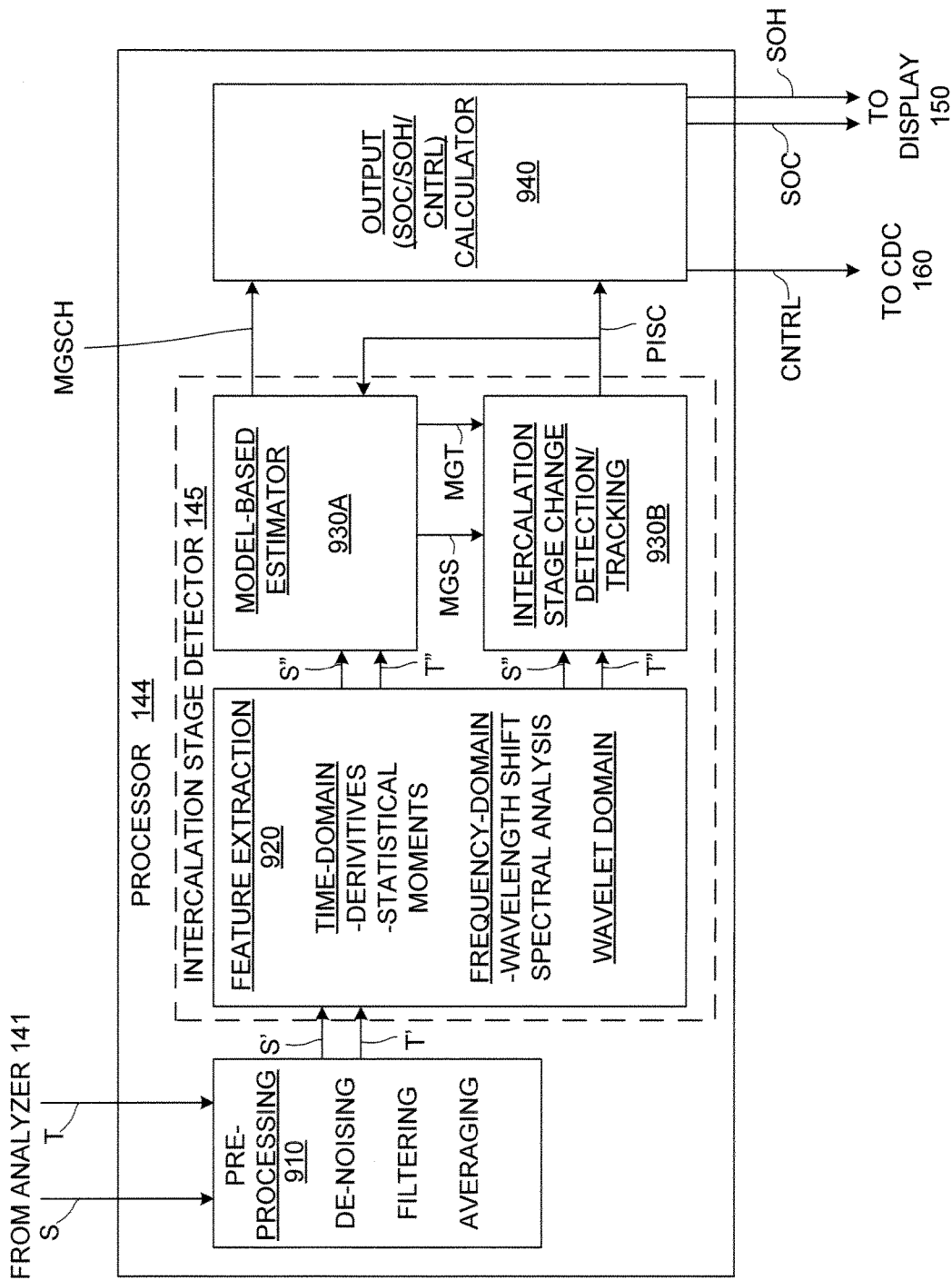
FIGS. 9(A) and 9(B) are block and flow diagrams, respectively, that illustrate a processor and process for generating operating state information and control information using detected intercalation stage changes according to an embodiment of the present invention.
Figure 9B:
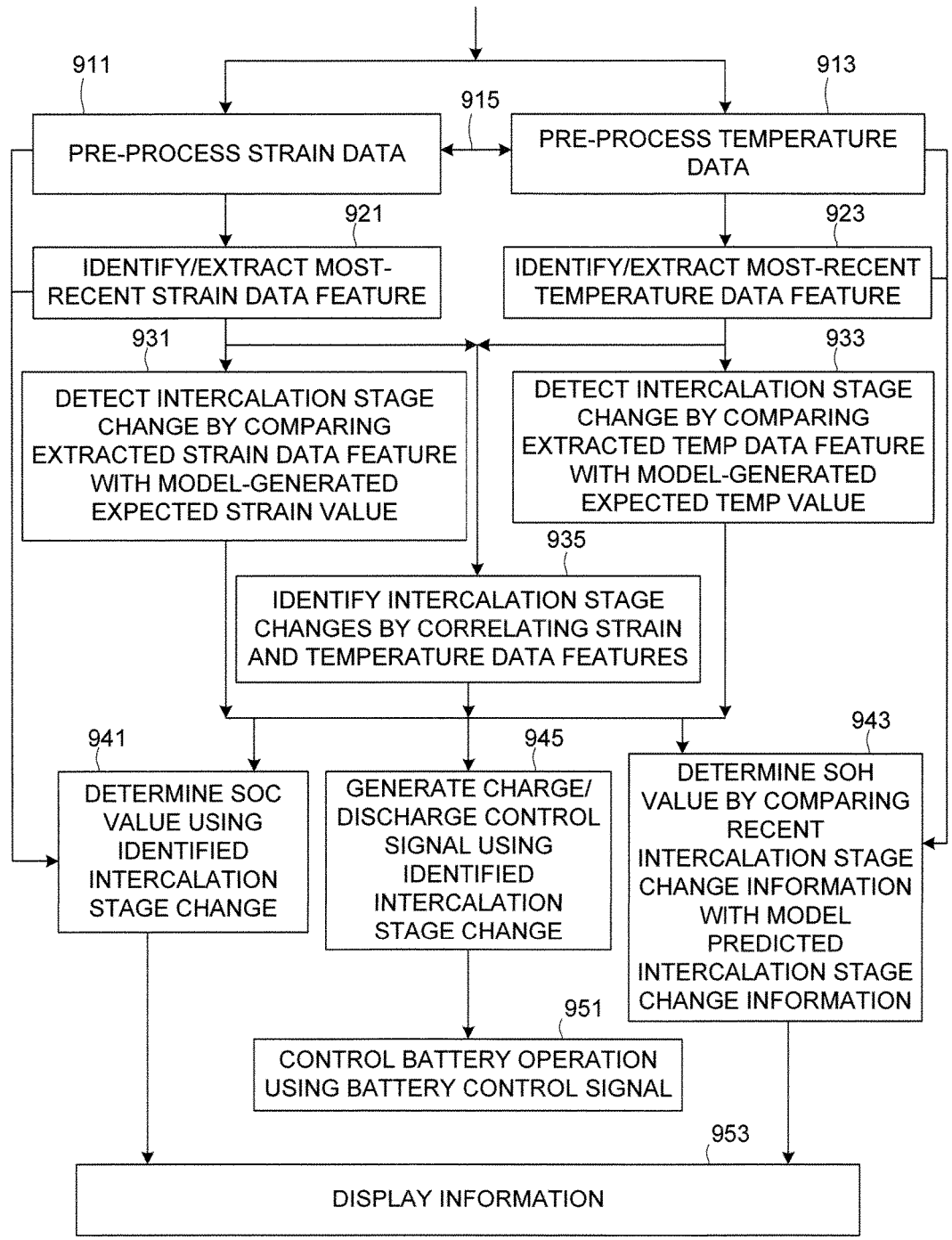

FIG. 9(A) is a block diagram showing processor 144 of FIG. 1(A) according to a specific embodiment using simplified functional format, and FIG. 9(B) is a flow diagram indicating generalized operations performed by processor 144 according to alternative embodiments. As indicated in FIG. 9(A), processor 144 generally includes a pre-processing section 910, intercalation stage detector 145, and an output calculator section 940.

Referring to the left side of FIG. 9(A), pre-processing section 910 receives "raw" strain data S and temperature data T from light source/analyzer 141, performs one or more known pre-processing operations (e.g., de-noising, filtering, and averaging), and generates pre-processed strain data S' and temperature data T' that is passed to intercalation stage detector 145. As indicated in blocks 911 and 913 in FIG. 9(B), in one embodiment strain data S is processed separately from temperature data T. As indicated by double-arrow line 915, in another embodiment both strain and temperature data are processed simultaneously such that pre-processed strain data S' is deconvoluted using temperature data T, and/or pre-processed temperature data T' is deconvoluted using strain data S.

Referring to the center of FIG. 9(A), in accordance with an embodiment of the invention, intercalation stage detector 145 includes a feature extraction section 920 for identifying and extracting at least one data feature from pre-processed strain data S' and pre-processed temperature data T', a model-based estimator section 930A, and an intercalation stage change detection/tracking section 930B that function to detect at least one intercalation stage change of EED 110 in accordance with the measured operating parameter data obtained from the optical sensors.

In a specific embodiment, feature extraction section 920 applies one or more known data analysis techniques (e.g., time-domain analysis, frequency-domain analysis, and/or wavelet domain analysis) to pre-processed strain data S' and temperature data T' in order to identify strain data features S" and temperature data features T". As indicated by blocks 921 and 923 in FIG. 9(B), in a specific embodiment this process involves separately extracting most-recent strain data features and most-recent temperature data features.

Referring to FIG. 9(A), according to an embodiment of the present invention, model-based estimator section 930A performs a model-based estimation process 930A that generates estimated "model-based" parameter values (e.g., model-generated strain value MGS and model-generated temperature value MGT) based on previously measured strain/temperature values, and intercalation stage detection/tracking section 930B performs a detection/tracking process that compares the estimated strain/temperature values MGS and MGT with present (most-recent) strain/temperature features S" and T" to detect a present intercalation stage change PISC. Referring to FIG. 9(B), in accordance with alternative embodiments, one or both of strain/temperature features S" and T" are utilized in the detection of present intercalation stage change PISC. For example, in block 931, an extracted strain data feature S" is compared with a model-generated strain value MGS associated with previous intercalation stage changes to detect present intercalation stage change PISC. Alternatively, as indicated in block 933, an extracted temperature data feature T" is compared with a model-generated temperature value MGT associated with previous intercalation stage changes to detect said present intercalation stage change PISC. Finally, as indicated in block 935, a strain data feature S" is correlated with a current temperature data feature T" to identify present intercalation stage change PISC.

Referring again to model-based estimator 930A (FIG. 9(A)), the model-based estimation process also calculates a difference between the estimated and present strain/temperature values, and generates/updates an intercalation stage transition point history MGSCH, which is supplied to output calculator section 940. Output calculator section 940 functions to generate at least one of (a) operating state information SOX (e.g., state-of-charge (SOC), state-of-health (SOH), or state-of-power (SOP) information and (b) charge/discharge control information CNTRL in accordance with at least one of present intercalation stage change PISC and intercalation stage transition point history MGSCH.

Referring to block 941 in FIG. 9(B), in one specific embodiment a most-recent SOC value is generated using most-recent intercalation stage change PISC, e.g., by comparing most-recent intercalation stage change PISC with intercalation stage transition point history MGSCH. As discussed in additional detail herein, intercalation stage changes occur at predictable battery charge levels, so determining a most-recent SOC value is achieved by recording a history of intercalation stage changes during multiple charge/discharge cycles, and keeping track of the most recently occurring stage changes. By continuously monitoring intercalation stage changes occurring inside a battery (or other EED), updating the most-recent SOC value, and generating a suitable visual display (e.g., using display device 150 shown in FIG. 1(A); see block 953), the present invention provides SOC information that is far more accurate and reliable than that provided by conventional methodologies relying on voltage and battery current.

Referring to block 943 in FIG. 9(B), in another specific embodiment a most-recent SOH value is generated by comparing most-recent intercalation stage change CISC with model-predicted intercalation stage change information (e.g., supplied in intercalation stage transition point history MGSCH). As discussed in additional detail herein, intercalation stage changes occur on a predictable operating schedule, so identifying anomalies in the pattern of intercalation stage changes (e.g., unusual onset delays or durations) that cannot be accounted for by environmental considerations (e.g., high ambient temperatures) provides a reliable methodology for determining SOH of a battery or other EED. By continuously monitoring intercalation stage changes occurring inside a battery (or other EED), updating the most-recent SOH value in accordance with the analysis discussed herein, and generating a suitable visual display (e.g., using display device 150 shown in FIG. 1(A)), the present invention provides SOH information that is far more accurate and reliable than that provided by conventional methodologies relying on voltage and current.

Referring to block 945 in FIG. 9(B), in another specific embodiment a charge/discharge control signal CNTRL is generated in accordance with present intercalation stage change PISC, and then (block 951) one of a charging operation and a discharging operation of EED is controlled in accordance with control signal CNTRL.

In one embodiment, the model-based estimation process performed by intercalation state detector 145 effectively models the subject EED (e.g., a Lithium-ion battery) as a dynamical system that is influenced by the load current (the input), and responds with estimated strain and temperature values (the output). The model is initiated with an initial strain and temperature at time t=0, and compares for subsequent time instants the "present" (most-recently) measured strain and temperature data with the previous strain and temperature values, and then feeds the difference back in order to estimate internal battery states such as SOC that are not observed at the output, and to provide filtered updated estimates of the strain and temperature. In alternative embodiments, load current measurements are either used or not used in the model calculations. In another embodiment, the model-based estimation process is based on a single model or a collection of models corresponding to each of the intercalation stages.

The processor details and methodology described above with reference to FIGS. 9(A) and 9(B) will now be described in additional detail with reference to FIGS. 10 through 16, which include various timing diagrams that are used to explain the purpose and benefit of performing feature extraction and intercalation stage change detection.

Figure 10:
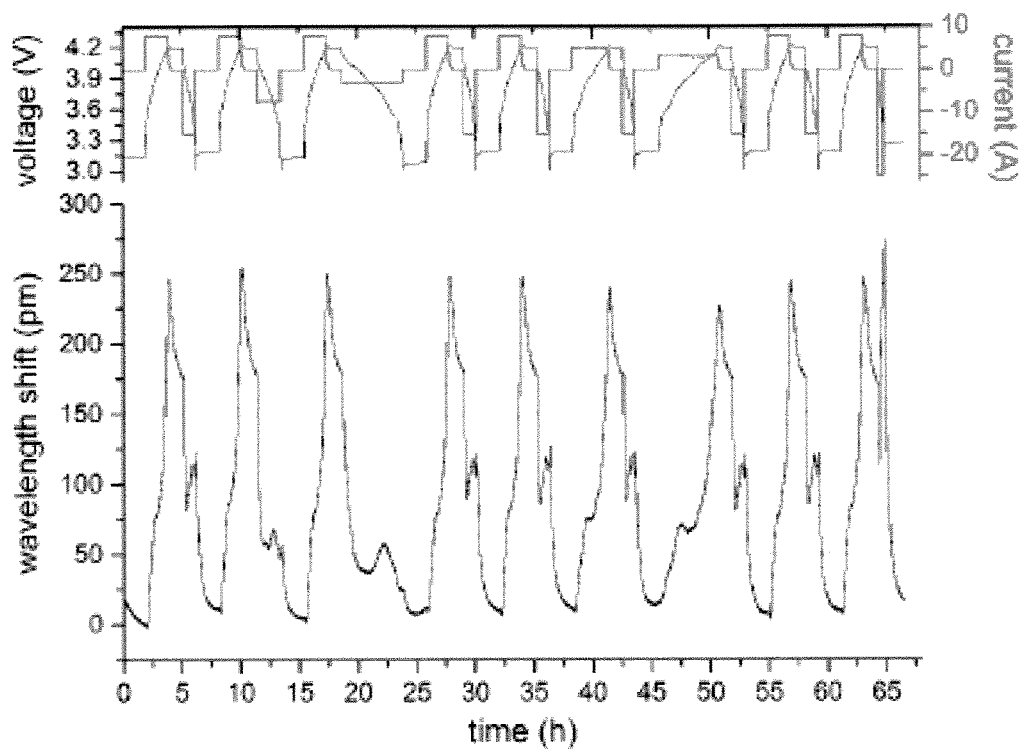
FIG. 10 is a two-part diagram depicting FO output signals including strain-induced and temperature-induced contributions (information)

FIG. 10 is a timing diagram showing output signal (wavelength shift data) generated by an exemplary FO sensor that was mounted on an Li-ion battery in the manner described above with reference to optical sensor 130-1 of FIG. 1(A). The upper portion of the diagram shows current (indicated by the more square-waveform line) and output voltage versus time. The diagram indicates signals taken while the Li-ion battery cell was cycled at different Charge-rates (C-rates), and the data indicates temperature and strain induced wavelength changes during cycling. For data shown in FIG. 10, the battery was discharged with various C-rates (C, C/2, C/5, 2C (very last cycle)) while charged with a constant C-rate (C/2). This cycling is performed to ensure that each discharge starts from the same SOC value. Afterwards the battery was charged with various C-rates (C/2, C/3, C/5) while discharged with a constant C-rate. The measured wavelength shift is a convolution of strain-induced and temperature-induced wavelength shifts.

Figure 11:
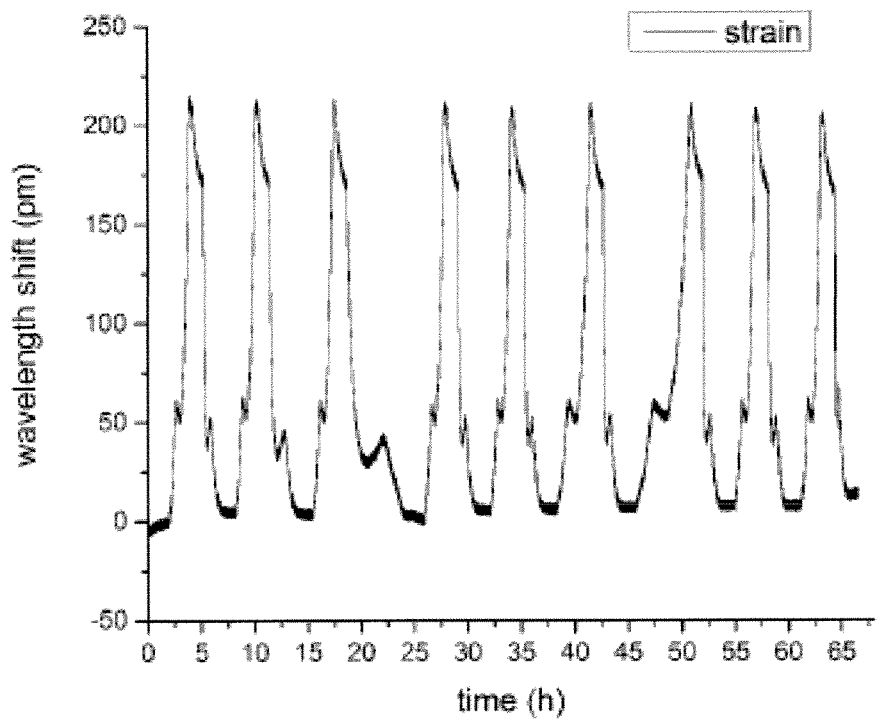
FIG. 11 is a diagram depicting strain-induced wavelength changes for different charge/discharge cycles.
Figure 12:
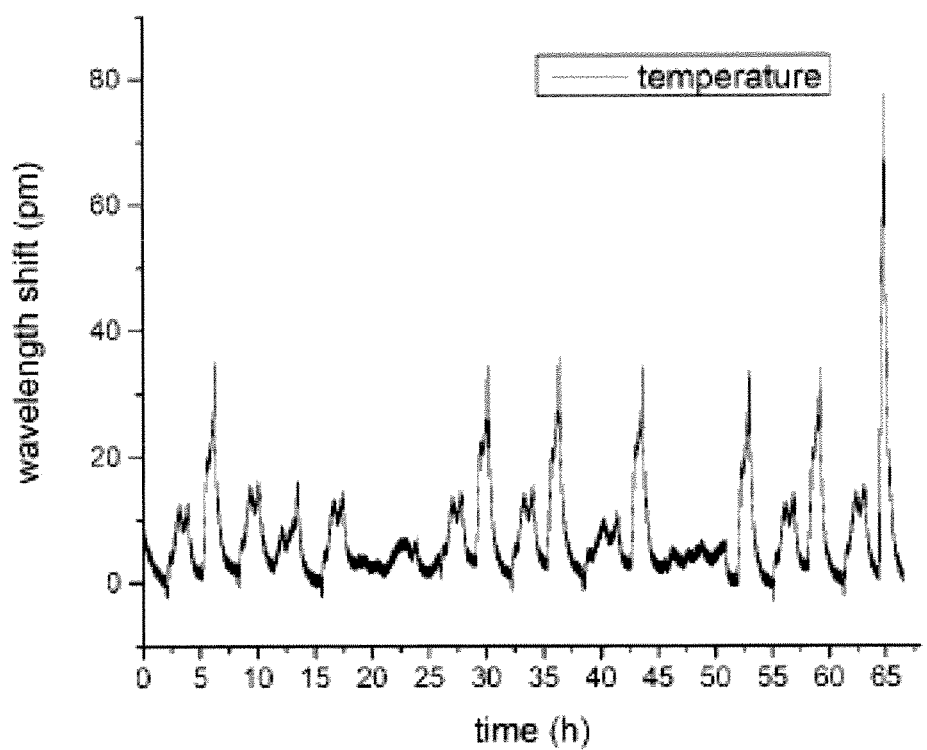
FIG. 12 is a diagram depicting temperature-induced wavelength changes for different charge/discharge cycles.

According to one embodiment of the present invention, the strain and temperature data is analyzed as-is to extract data features that are characteristic to a most-recent intercalation stage change. In many cases however it may be favorable to de-convolute the temperature- and strain-induced changes before data analysis, which is accomplished using various known methods as discussed above. FIG. 11 shows de-convoluted strain, and FIG. 12 shows the de-convoluted temperature data of measurement shown in FIG. 10. By analyzing these corrected data it is possible to extract informative data features.

In a preferred embodiment, strain data S is de-convoluted using temperature data T (i.e., the processed strain information is modified to remove temperature related effects in order to extract "pure" strain information that allows estimate of accurate SOC values). The present inventors found through experimentation that different intercalation stages in Li-ion batteries are characterized by strain-derived wavelength shift time-series features that remain stable with respect to charge/discharge rates. Using Coulomb counting on standard charge and discharge cycles, the present inventors found that time-series features like gradients and points of inflection, as well as shape features like peaks and radii of curvature, can be recognized using known processing techniques, and correlated to intercalation stages that correspond with associated SOC values. The extracted features from strain data S correlate nicely with features in the open circuit voltage which are typically used to visualize different Li-intercalation stages. These features are typically only visible using voltage data at very low C-rates (e.g., C/25). In contrast, the features in the extracted strain data generated by way of FO sensor are observable at higher C-rates and are visible for different C-rates at the same SOC values. Once this correlation function has been identified using machine-learning algorithms, the correlation function is used for estimating the SOC at real-time during charge or discharge based on the extracted strain information (i.e., the measured strain data S values determined by wavelength shift, corrected for temperature effects using temperature data T).

Figure 13:
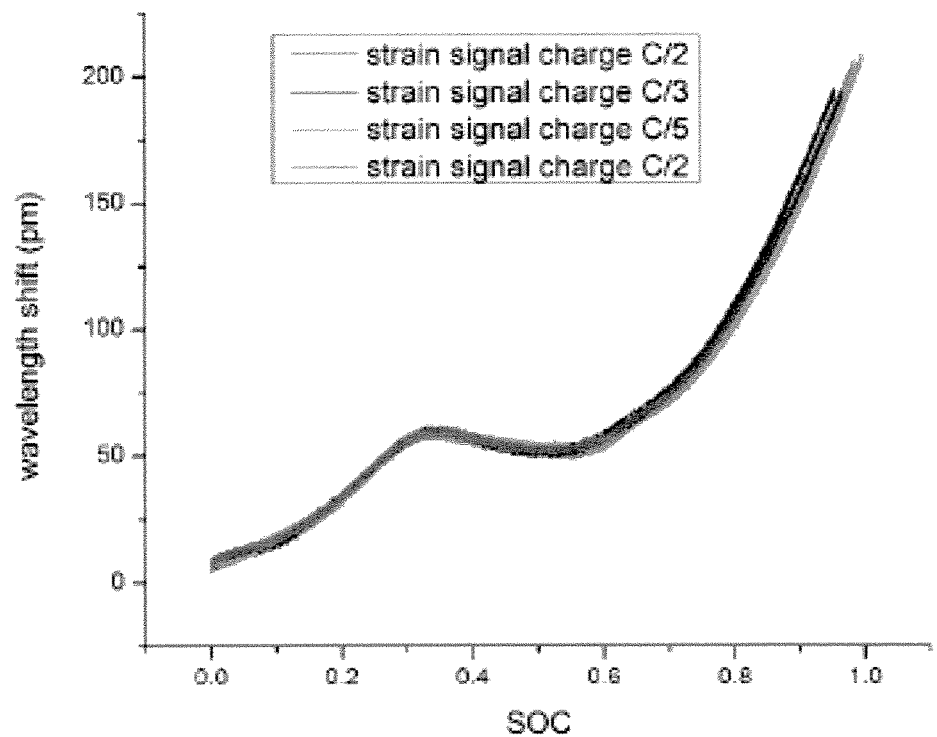
FIG. 13 is a diagram depicting strain signal versus SOC obtained for different various charge cycles at different Charge-rates.
Figure 14:
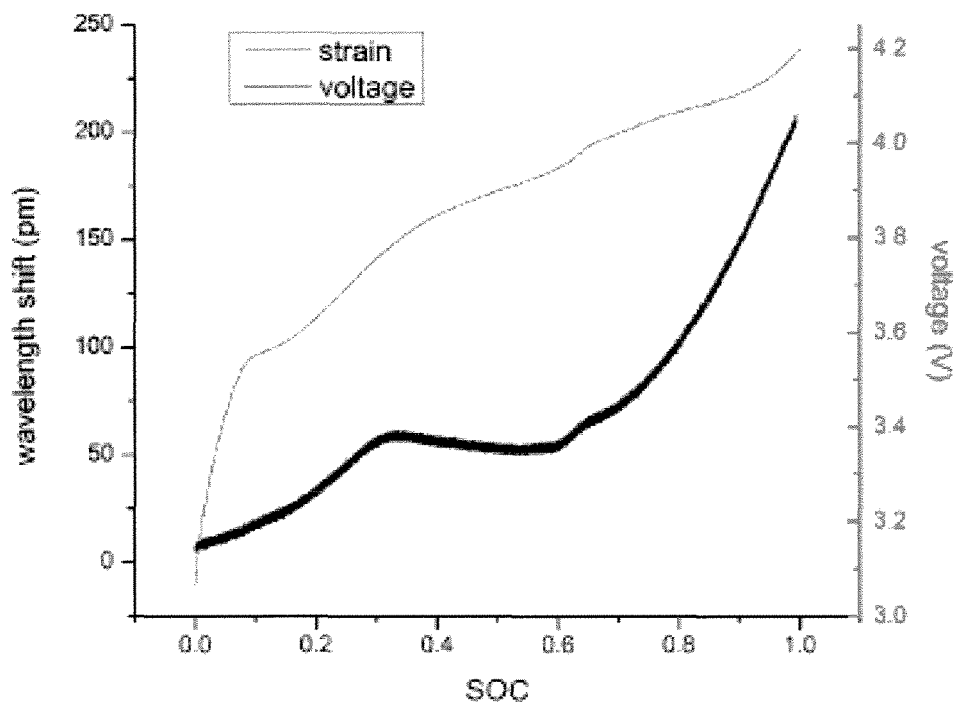
FIG. 14 is a diagram comparing strain-induced wavelength shift and voltage data versus SOC obtained for a C/25 charge cycle.

One approach to analyze and understand the corrected strain and temperature signals is to plot the data of each individual charge or/and discharge cycles versus state-of-charge (SOC), and to store the data in a memory for reference during intercalation stage change identification (analysis). The SOC values can be determined by using Coulomb-counting during charge/discharge cycles. FIG. 13 shows extracted strain data versus SOC for several charge cycles obtained at different charge rates (C-rates). All curves obtained with different C-rates are almost lying on top of each other, which mean that the measured strain and the value of SOC are being strongly correlated to each other. All strain curves are showing characteristic features which are located at exactly the same SOC values. Assigning these characteristic features to corresponding Li-ion intercalation stages in the battery is achieved by comparing these curves to data of the voltage (or open circuit voltage) measured at low C-rates. Such measurements are typically used to visualize different Li-ion intercalation stages. FIG. 14 shows both the strain-induced wavelength shift vs. SOC and the voltage vs. SOC for a C/25 charge cycle in comparison. Please note that the features in voltage data are typically only visible at very low C-rates (e.g., C/25). In contrast the characteristic features in the strain data can still be observed at larger C rates. In addition, the characteristic features are observable at exactly the same SOC values independent with what C-rate they have been measured.

Referring briefly to FIG. 9(A), feature extraction section 920 utilizes one or more known data analysis techniques in order to identify the strain and temperature data features for purposes of identifying corresponding intercalation stages.

Figure 15:
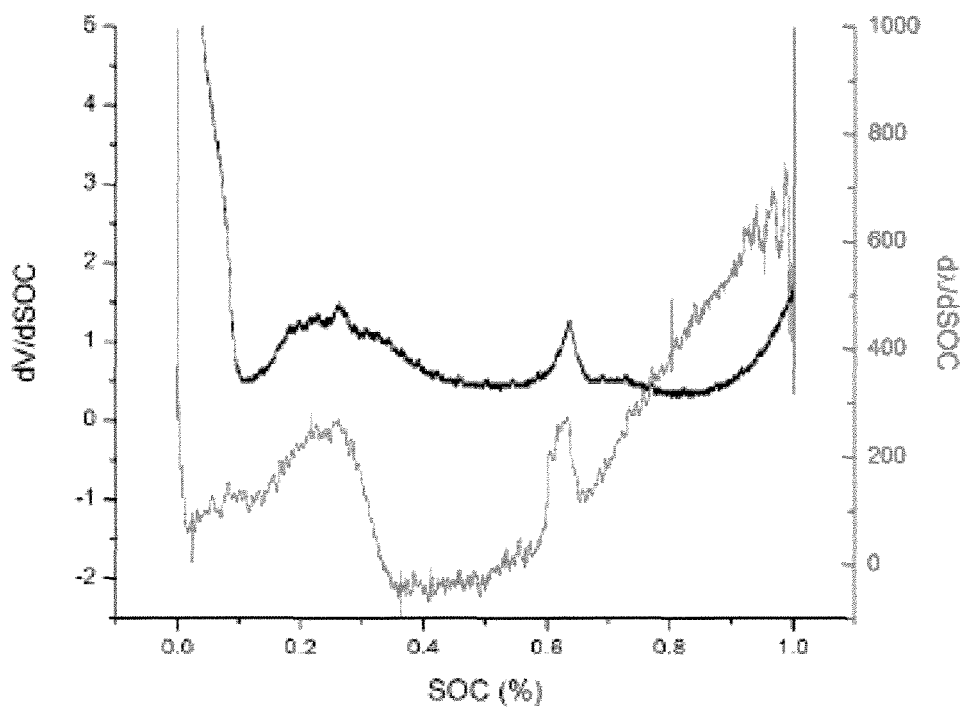
FIG. 15 is a diagram depicting a derivative of strain-induced wavelength shift data for a C/5 charge cycle in comparison with the derivative of voltage data measured for a C/25 charge cycle.

These techniques include time-domain analysis (e.g., analyzing derivatives or statistical moments), frequency-domain analysis (e.g., wavelength shift spectral analysis), or wavelet domain analysis. In a presently preferred embodiment, derivatives of the strain and temperature data are calculated and analyzed in order to identify the characteristic features associated with corresponding intercalation stages, which in turn may be used to calculate a battery's present (i.e., most-recent) SOC. For illustrative purposes, FIG. 15 shows a comparison of the derivative of the strain data at C/5 and voltage data at C/25.

Figure 16:
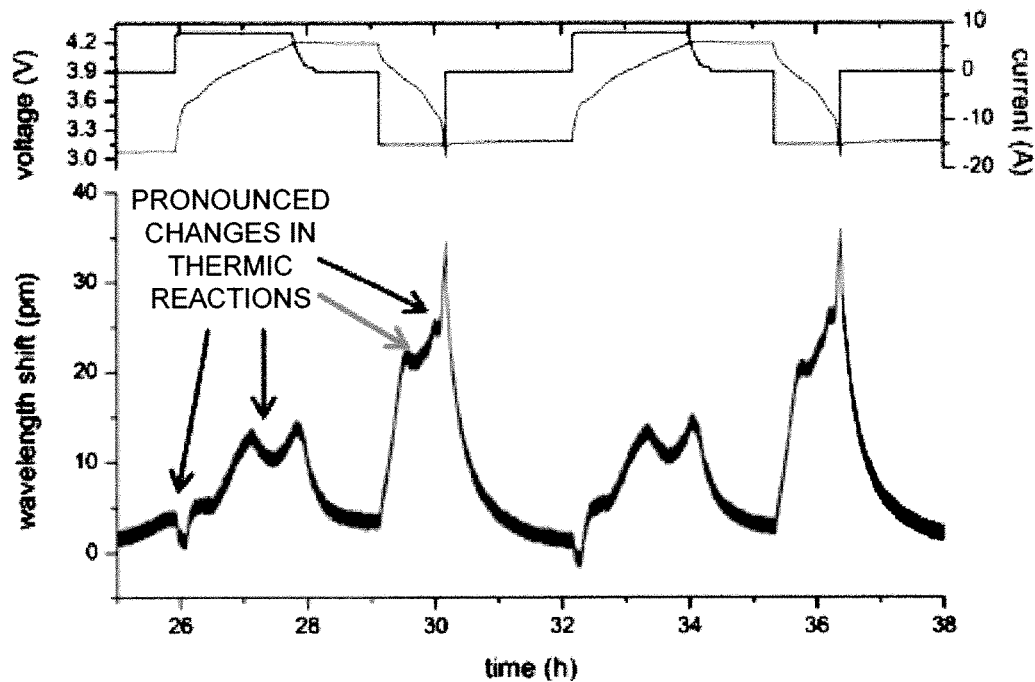
FIG. 16 is a diagram depicting temperature changes in an Li-ion battery versus time.
Figure 17:
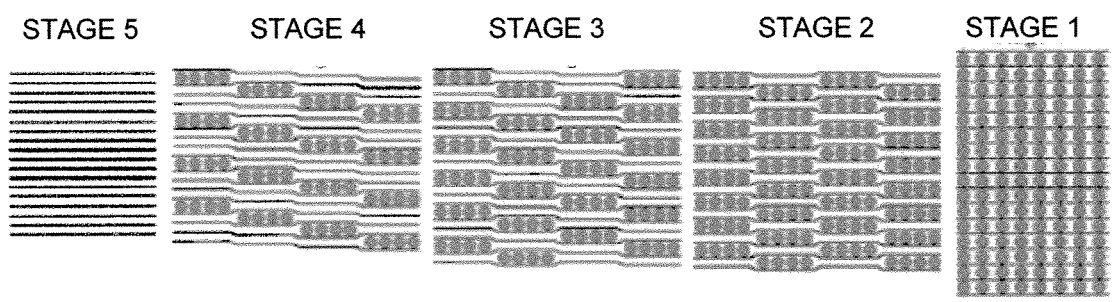
FIG. 17 is a simplified diagram depicting various intercalation stages in a Li-ion battery.

In addition to detecting intercalation stage changes using strain data S, intercalation stage changes of certain EEDs (e.g., Li-ion batteries) are also detectable by way of detecting certain temperature changes (e.g., heat generation) that are indicated by temperature data T. These temperature data features are, for instance, related to endothermic and exothermic reactions which take place during charge and discharge of a Li-ion battery. FIG. 16 shows two cycles with a C/2 charge and 1C discharge. Within both the charge and discharge phase one can clearly observe certain endothermic, exothermic reactions and changes of exothermic reactions. In FIG. 16, the most pronounced endothermic or changes of exothermic reaction during the first charge and discharge cycle are marked with arrows. Note that the wavelength shift on the y-axis is directly correlated to the internal temperature (i.e., 1 pm wavelength shift correlates to a temperature change of about 0.1° C.). These characteristic features in temperature data clearly show that, at specific SOC values, endothermic and different exothermic reaction take place that are believed to be associated with corresponding intercalation stage changes. Closely monitoring the internal temperature of EED 110 does therefore also facilitate identifying different Li-ion intercalation stages during charge and discharge of EED 110. In a specific embodiment, the temperature data features indicating intercalation stage changes are correlating with the strain data features, obtained as discussed above, thereby providing another method for identifying intercalation stage change events.

In addition to utilizing strain and thermal data features to determine most-recent SOC values, any changes of the onset or duration of intercalation stages with respect to SOC during either charge or discharge can be used to signify degradation of the battery chemistry. Using long-term cycling experiments, these intercalation stage onset and duration features, expressed in terms of SOC, can be used to determine the SOH of the battery. Typically the reversible changes are useful for SOC estimation while the irreversible changes are useful for SOH estimation.

In addition to using strain and thermal data obtained in the manner described above to determine SOH values, other structural changes may be monitored and utilized in the SOH determination as well. For example, the structural integrity of a battery cell in general, the structural integrity of electrode material, quality of electrolyte (e.g. gas formation due to electrolyte decomposition), sealing of cell package itself and so forth can be monitored by measuring strain and temperature inside and/or outside of the battery cell. The idea is to identify characteristic features in the strain and temperature data which are correlated to the reversible and irreversible structural changes discussed above.

The specifications for the monitoring and management systems detailed above allow real-time (at 100 Hz) detection of intercalation stage changes by way of temperature and strain parameters. Thus, it is feasible to approach 100% diagnostic sensitivity. The immunity to EMI and ability to function in harsh environments without degraded performance implies that false alarms from such systems will be minimal, thereby making it realistic to achieve >95% diagnostic specificity.

Due to uncertainties in estimates of internal cell-state variables, most commercial Li-ion battery systems today are conservatively designed and thus typically only allow access to a limited depth of discharge (up to 90%) of their stored energy capacity. Embodiments disclosed herein enable accurate real-time (at 100 Hz) detection of intercalation stage changes by way of measured temperature and strain parameters that enable high-accuracy (2.5%) predictions of remaining battery charge, allowing reductions in conservative over-design. In addition, using algorithms that are based on accurate intercalation stage measurements, it is feasible to get more accurate state-of-health estimates and extend cell life, resulting in even greater reductions in over-sizing design practices.

The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

The invention claimed is:

1. A processor implemented method for operating an electrochemical energy device, said electrochemical energy device including an electrode material and a guest species, the method comprising:
   utilizing one or more optical sensors to measure a present operating parameter of the electrochemical energy device, said measured present operating parameter being associated with an operating condition of said electrochemical energy device;
   transmitting at least one light signal from said one or more optical sensors along an optical fiber to a processor, wherein said at least one light signal includes present parameter data that is proportional to said measured present operating parameter; and
   analyzing said present parameter data in the processor, the processor configured to detect at least one intercalation stage change of the electrochemical energy device based on the present parameter data, said detected at least one intercalation stage change being caused by migration of the guest species within the electrode material such that said migration causes a characteristic change in said measured present operating parameter, the processor generating an output indicating at least one of operating state information and control information in accordance with said detected at least one intercalation stage change.

2. The method of claim 1,
   wherein utilizing said one or more optical sensors comprises measuring one of a strain parameter and a temperature parameter of the electrochemical energy device, and
   wherein transmitting said at least one light signal comprising transmitting at least one a first light signal including strain data associated with said measured strain parameter, and a second light signal including temperature data associated with said measured temperature parameter.

3. The method of claim 2, wherein utilizing said one or more optical sensors comprises utilizing a first optical sensor to measure said strain parameter, and utilizing a second optical sensor to measure said temperature parameter.

4. The method of claim 3, wherein said first and second optical sensors are disposed on a single optical fiber such that transmitting said at least one light signal comprising transmitting both said first and second light signals on said single optical fiber.

5. The method of claim 1, wherein utilizing one or more optical sensors comprises at least one of:
measuring at least one operating parameter from an external surface of a cell wall of the electrochemical energy device, and
measuring at least one operating parameter from an internal location of said electrochemical energy device.

6. The method of claim 5, wherein utilizing one or more optical sensors comprises:
utilizing a first optical sensor disposed on said optical fiber that is operably attached to an external surface of the cell wall of the electrochemical energy device such that the first optical sensor is configured to measure mechanical strain of the cell wall, and
utilizing a second optical sensor disposed on the optical fiber that is operably attached to the external surface of the cell wall such that the second optical sensor is configured to measure an external temperature of the cell wall.

7. The method of claim 5, wherein utilizing one or more optical sensors comprises:
utilizing a first optical sensor disposed on said optical fiber that extends through the cell wall and is operably attached to at least one of an internal surface the cell wall and said electrode material of the electrochemical energy device such that the first optical sensor is configured to measure mechanical strain from inside said cell wall, and
utilizing a second optical sensor disposed on the optical fiber and is operably attached to said at least one of the internal surface the cell wall and said electrode material such that the second optical sensor is configured to measure an internal temperature from inside said cell wall.

8. The method of claim 1, wherein utilizing said one or more optical sensors comprises utilizing one of a fiber Bragg grating sensor, an etalon sensor, and a Fabry-Perot sensor.

9. The method of claim 1, wherein transmitting said at least one light signal to said processor comprising utilizing a linear variable filter to convert said at least one light signal into electrical signals including said parameter data, wherein said linear variable filter comprise means for resolving sub-picometer wavelength shifts in said at least one light signal.

10. The method of claim 1, wherein identifying said at least one intercalation stage change comprises extracting at least one data feature from said from said operating parameter data using one of time-domain analysis, frequency-domain analysis and wavelet domain analysis, and analyzing said extracted data feature to detect said present intercalation stage change.

11. The method of claim 10, wherein said analyzing said extracted data feature comprises comparing an extracted strain data feature with a model-generated strain value associated with previous intercalation stage changes to detect said present intercalation stage change.

12. The method of claim 10, wherein said analyzing said extracted data feature comprises comparing an extracted temperature data feature with a model-generated temperature value associated with previous intercalation stage changes to detect said present intercalation stage change.

13. The method of claim 10, wherein said analyzing said extracted data feature comprises correlating a present strain data feature with a present temperature data feature to identify said present intercalation stage change.

14. The method of claim 10, wherein generating the output indicating at least one of operating state information and control information comprises determining at least one of a state-of-charge value and a state-of-health value in accordance with said detected present intercalation stage change, and then visually displaying said at least one of said state-of-charge and said state-of-health value.

15. The method of claim 10, wherein generating the output indicating at least one of operating state information and control information comprises generating a charge/discharge control signal in accordance with said detected present intercalation stage change, and then controlling one of a charging operation and a discharging operation of said electrochemical energy device in accordance with said charge/discharge control signal.

16. The method of claim 1, wherein the electrochemical energy device comprises one of a rechargeable battery, a supercapacitor and a fuel cell disposed on one of a hybrid/electric vehicle and a smart grid system, and wherein the method further comprises visually displaying said at least one of a state-of-charge value and a state-of-health value to an operator of said one of said hybrid/electric vehicle and said smart grid system.

17. The method of claim 16, wherein said electrochemical energy device comprises a Lithium-ion battery, wherein utilizing said one or more optical sensors comprises measuring one of a strain parameter and a temperature parameter of said Lithium-ion battery, and wherein generating said charge/discharge control information comprises at least one of controlling a charging rate of said Lithium-ion battery and controlling a discharge rate of said Lithium-ion battery.

18. A processor implemented method for determining at least one of state-of-charge (SOC) information, state-of-health (SOH) information, and charge/discharge control information for a Lithium-ion battery comprising a cell wall surrounding an electrode material and Lithium-ions as guest species, the method comprising:
utilizing one or more optical sensors to measure at least one of a strain parameter and a temperature parameter of said Lithium-ion battery;
transmitting at least one light signal from said one or more optical sensors along an optical fiber from said Lithium-ion battery to a processor, wherein said at least one light signal includes present parameter data that is proportional to said measured one of said strain parameter and said temperature parameter;
analyzing said present parameter data in a processor configured to detect at least one intercalation stage change of the Lithium-ion battery based on the present parameter data, said detected at least one intercalation stage change being caused by migration of the guest species within the electrode material such that said migration causes a characteristic change in said measured one of said strain parameter and said temperature parameter, the processor generating an output indicating at least one of operating state information and control information in accordance with said detected at least one identified intercalation stage change, wherein said operating state information corresponds to an operating state of said Lithium-ion battery.

19. The method of claim 18,
wherein identifying said at least one intercalation stage change comprises extracting at least one data feature from said operating parameter data using one of time-domain analysis, frequency-domain analysis and wavelet domain analysis, and wherein analyzing said extracted data feature to detect said present intercalation stage change comprises comparing one of an extracted strain data feature and an extracted temperature data feature with a model-generated value associated with previous intercalation stage changes to detect said present intercalation stage change.

20. A system, comprising:

an electrochemical energy device comprising an electrode material and an guest species;

one or more optical fibers having a first portion connected to the electrochemical energy device;

first and second optical sensors disposed on the one or more optical fibers, the first optical sensor configured to sense a strain parameter of the electrochemical energy device, and the second optical sensor configured to sense a temperature parameter of the electrochemical energy device;

a light source configured to provide light to the one or more optical fibers;

a detector including means for detecting first and second light signals reflected by and received from the first and second optical sensors, for generating strain data signals based on the first light signals received from the first optical sensor, and for generating temperature data signals based on the second light signals received from the second optical sensor; and a processor configured to:

detect a present intercalation stage change of the electrochemical energy device by analyzing at least one of the strain data signals and the temperature data signals using model-based parameter values, said intercalation stage changes being caused by migration of the guest species within the electrode material; and generate at least one of state-of-charge (SOC) information, state-of-health (SOH) information, and charge/discharge control information using said detected present intercalation stage change.

* * * * *